(12) United States Patent
Cho et al.

(10) Patent No.: US 11,737,323 B2
(45) Date of Patent: Aug. 22, 2023

(54) DISPLAY DEVICE

(71) Applicant: Samsung Display Co., Ltd., Yongin-si (KR)

(72) Inventors: Yuhyun Cho, Yongin-si (KR); Sora Kwon, Yongin-si (KR); Oukjae Lee, Yongin-si (KR); Ilryong Cho, Yongin-si (KR)

(73) Assignee: SAMSUNG DISPLAY CO., LTD., Yongin-si (KR)

( * ) Notice: Subject to any disclaimer, the term of this patent is extended or adjusted under 35 U.S.C. 154(b) by 154 days.

(21) Appl. No.: 17/100,088

(22) Filed: Nov. 20, 2020

(65) Prior Publication Data
US 2021/0202657 A1    Jul. 1, 2021

(30) Foreign Application Priority Data

Dec. 31, 2019    (KR) .......................... 10-2019-0179978

(51) Int. Cl.
*G09G 3/3275* (2016.01)
*H10K 59/131* (2023.01)

(52) U.S. Cl.
CPC ......... *H10K 59/131* (2023.02); *G09G 3/3275* (2013.01)

(58) Field of Classification Search
CPC .......................... H01L 27/3276; G09G 3/3275
See application file for complete search history.

(56) References Cited

U.S. PATENT DOCUMENTS

| 8,102,349 | B2 | 1/2012 | Ashizawa et al. |
| 9,786,229 | B2* | 10/2017 | Lee ...................... H01L 27/3276 |
| 10,964,284 | B2* | 3/2021 | Fujikawa ............. G09G 3/3688 |
| 2007/0002243 | A1 | 1/2007 | Kim |
| 2020/0175917 | A1 | 6/2020 | Jo et al. |
| 2020/0251539 | A1* | 8/2020 | Fu ....................... H01L 27/3216 |

FOREIGN PATENT DOCUMENTS

| KR | 10-2007-0002278 | 1/2007 |
| KR | 10-0784707 | 12/2007 |
| KR | 10-0964768 | 6/2010 |
| KR | 10-2015-0079206 | 7/2015 |
| KR | 10-2017-0073125 | 6/2017 |
| KR | 10-2020-0066504 | 6/2020 |

* cited by examiner

*Primary Examiner* — Nelson M Rosario
*Assistant Examiner* — Scott D Au
(74) *Attorney, Agent, or Firm* — Kile Park Reed & Houtteman PLLC

(57) ABSTRACT

A display device includes a substrate including a first area, a display area surrounding the first area, and a peripheral area surrounding the display area and including a bent area; a display unit including pixels; a driving circuit in the peripheral area; and a fan-out unit in the peripheral area and including a first wiring portion and a second wiring portion apart from each other in the bent area. The first wiring portion includes first wirings. Each of the first wirings includes a first portion extending in a first direction between the display unit and the bent area, and a second portion extending in a second direction. A width of the first portion is greater than a width of the second portion.

22 Claims, 22 Drawing Sheets

DISPLAY DEVICE

CROSS-REFERENCE TO RELATED APPLICATION(S)

This application claims priority to and benefits of Korean Patent Application No. 10-2019-0179978 under 35 U.S.C. § 119, filed on Dec. 31, 2019, in the Korean Intellectual Property Office, the entire contents of which are incorporated herein by reference.

BACKGROUND

1. Technical Field

One or more embodiments relate to a display device, and, to a display device in which emission uniformity of an emission area is improved.

2. Description of the Related Art

Organic light-emitting display devices, among display devices, have advantages of wide viewing angles, excellent contrast, and fast response speeds, and thus are in the limelight as next-generation display devices.

Generally, in an organic light-emitting display device, thin-film transistors and organic light-emitting diodes may be formed or disposed over a substrate, and the organic light-emitting diodes may spontaneously emit light. The organic light-emitting display device may be used as a display unit of a miniaturized product such as a mobile phone and may be used as a display unit of a large-scale product such as a television.

The display device such as the organic light-emitting display device may include a display unit located or disposed on a substrate and a fan-out area including a wiring that may extend to the outside of the display unit. Visibility at various angles may be improved or an area of a non-display area may be reduced by bending at least a portion of the display device.

It is to be understood that this background of the technology section is, in part, intended to provide useful background for understanding the technology. However, this background of the technology section may also include ideas, concepts, or recognitions that were not part of what was known or appreciated by those skilled in the pertinent art prior to a corresponding effective filing date of the subject matter disclosed herein.

SUMMARY

One or more embodiments include a display device in which emission uniformity of an emission area may be improved. However, it should be understood that embodiments described herein should be considered in a descriptive sense only and not for purposes of limitation of the disclosure.

Additional aspects will be set forth in part in the description which follows and, in part, will be apparent from the description, or may be learned by practice of the presented embodiments of the disclosure.

According to one or more embodiments, a display device may include a substrate that may include a first area, a display area surrounding the first area, and a peripheral area surrounding the display area and including a bent area, a display unit disposed in the display area and including a plurality of pixels, a driving circuit disposed in the peripheral area, and a fan-out unit disposed in the peripheral area between the display unit and the driving circuit to transfer a data signal applied from the driving circuit to the display unit. The fan-out unit may include a first wiring portion and a second wiring portion apart from each other in the bent area. The first wiring portion may include a plurality of first wirings. Each of the plurality of first wirings may include a first portion extending in a first direction between the display unit and the bent area, and a second portion extending in a second direction intersecting the first direction. A width of the first portion may be greater than a width of the second portion.

A predetermined number of the plurality of first wirings may be electrically connected to a plurality of data lines, and a predetermined number of the data lines may be routed with respect to the first area.

In the plurality of first wirings, an interval between first portions may be equal to or greater than an interval between the second portions.

A width of the first portion may be about 1.5 to about 2 times greater than a width of the second portion.

Each of the plurality of first wirings may include a third portion disposed in the bent area, and a width of the third portion may be greater than a width of the first portion.

Each of the plurality of first wirings may include a first conductive layer disposed between the display area and the bent area, a second conductive layer disposed in the bent area, and a third conductive layer disposed between the bent area and the driving circuit. The first conductive layer, the second conductive layer, and the third conductive layer may be electrically connected to each other.

The first conductive layer and the third conductive layer may include a same material.

The second conductive layer may include a material different from a material of the first conductive layer and a material of the third conductive layer.

The first conductive layer and the third conductive layer may include molybdenum (Mo).

The second conductive layer may include aluminum (Al).

The second conductive layer may be electrically connected to the first conductive layer and the third conductive layer through contact holes passing through an insulating layer disposed outside of the bent area.

The display unit may include a pixel circuit and a display element electrically connected to the pixel circuit. The pixel circuit may include a thin film transistor including a semiconductor layer, a gate electrode overlapping a portion of the semiconductor layer, and an electrode layer disposed above the gate electrode. The first conductive layer and the gate electrode may include a same material.

The second conductive layer and the electrode layer may include a same material.

The first area may include a transparent region.

The first area may include a non-display area.

The first area may be disposed at a top center of the display area.

The first wiring portion may be disposed at a central portion of the fan-out unit.

The first area may be disposed at a top-left side of the display area.

The first wiring portion may be disposed at a left side with respect to a central portion of the fan-out unit.

The first area may be disposed at a top-right side of the display area.

The first wiring portion may be disposed at a right side with respect to a central portion of the fan-out unit.

The display device may include a component disposed at a side of the substrate corresponding to the first area.

These and/or other aspects will become apparent and more readily appreciated from the following description of the embodiments, the accompanying drawings, and claims.

BRIEF DESCRIPTION OF THE DRAWINGS

The above and other aspects, features, and advantages of embodiments will be more apparent from the following description taken in conjunction with the accompanying drawings, in which.

DETAILED DESCRIPTION OF THE EMBODIMENTS

Figure 1:
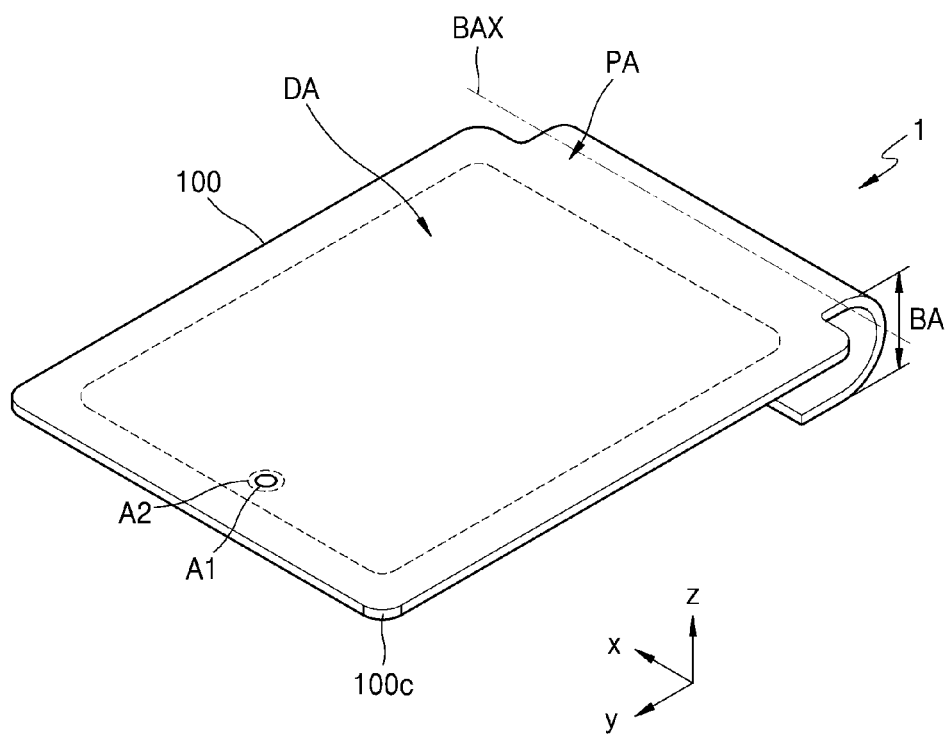
FIG. 1 is a perspective view of a portion or region of a display device according to an embodiment.

Reference will now be made in detail to embodiments, examples of which are illustrated in the accompanying drawings, wherein like reference numerals refer to like elements throughout. In this regard, the embodiments may have different forms and should not be construed as being limited to the descriptions set forth herein. Accordingly, the embodiments are merely described below, by referring to the figures, to explain aspects of the description.

Some of the parts which are not associated with the description may not be provided in order to describe embodiments of the disclosure and like reference numerals refer to like elements throughout the specification.

As used herein, the term "and/or" includes any and all combinations of one or more of the associated listed items. Throughout the disclosure, the expression "at least one of a, b or c" indicates only a, only b, only c, both a and b, both a and c, both b and c, all of a, b, and c, or variations thereof.

The terms "and" and "or" may be used in the conjunctive or disjunctive sense and may be understood to be equivalent to "and/or." In the specification and the claims, the phrase "at least one of" is intended to include the meaning of "at least one selected from the group of" for the purpose of its meaning and interpretation. For example, "at least one of A and B" may be understood to mean "A, B, or A and B."

As the disclosure allows for various changes and numerous embodiments, embodiments will be illustrated in the drawings and described in detail in the written description. Effects and characteristics of the disclosure, and a method of accomplishing the same will become apparent and more readily appreciated from the following description of the embodiments and the accompanying drawings. However, the disclosure is not limited to the embodiments herein and may be implemented in various forms. Hereinafter, when description is made with reference to the drawings, like reference numerals are given to like or corresponding elements and repeated descriptions thereof are omitted.

It will be understood that although the terms "first," "second," etc. may be used herein to describe various components, these components should not be limited by these terms. These components are only used to distinguish one component from another. For instance, a first element or component discussed below could be termed a second element or component without departing from the teachings of the disclosure. Similarly, the second element or component could also be termed the first element or component.

As used herein, the singular forms "a," "an," and "the" are intended to include the plural forms as well, unless the context clearly indicates otherwise.

It will be further understood that when the terms "comprises," "comprising," "includes" and/or "including", "have" and/or "having" are used in this specification, they or it may specify the presence of stated features, integers, steps, operations, elements and/or components, but do not preclude the presence or addition of other features, integers, steps, operations, elements, components, and/or any combination thereof.

When a layer, film, region, substrate, or area, or element is referred to as being "on" another layer, film, region, substrate, or area, or element, it may be directly on the other film, region, substrate, or area, or element, or intervening films, regions, substrates, or areas, or elements may be present therebetween. Conversely, when a layer, film, region, substrate, or area, or element, is referred to as being "directly on" another layer, film, region, substrate, or area, or element, intervening layers, films, regions, substrates, or areas, may be absent therebetween. Further when a layer, film, region, substrate, or area, or element, is referred to as being "below" another layer, film, region, substrate, or area, or element, it may be directly below the other layer, film, region, substrate, or area, or element, or intervening layers, films, regions, substrates, or areas, or elements, may be present therebetween. Conversely, when a layer, film, region, substrate, or area, or element, is referred to as being "directly below" another layer, film, region, substrate, or area, or element, intervening layers, films, regions, substrates, or areas, or elements may be absent therebetween. Further, "over" or "on" may include positioning on or below an object and does not necessarily imply a direction based upon gravity.

The spatially relative terms "below", "beneath", "lower", "above", "upper", or the like, may be used herein for ease of description to describe the relations between one element or component and another element or component as illustrated in the drawings. It will be understood that the spatially relative terms are intended to encompass different orientations of the device in use or operation, in addition to the orientation depicted in the drawings. For example, in the case where a device illustrated in the drawing is turned over, the device positioned "below" or "beneath" another device may be placed "above" another device. Accordingly, the illustrative term "below" may include both the lower and upper positions. The device may also be oriented in other directions and thus the spatially relative terms may be interpreted differently depending on the orientations.

In the drawings, sizes and thicknesses of elements may be enlarged for better understanding, clarity, and ease of description thereof. However, the disclosure is not limited to the illustrated sizes and thicknesses. In the drawings, the thicknesses of layers, films, panels, regions, and other elements, may be exaggerated for clarity. In the drawings, for better understanding and ease of description, the thicknesses of some layers and areas may be exaggerated.

Further, in the specification, the phrase "in a plan view" means when an object portion is viewed from above, and the phrase "in a schematic cross-sectional view" means when a schematic cross-section taken by vertically cutting an object portion is viewed from the side.

Additionally, the terms "overlap" or "overlapped" mean that a first object may be above or below or to a side of a second object, and vice versa. Additionally, the term "overlap" may include layer, stack, face or facing, extending over, covering or partly covering or any other suitable term as would be appreciated and understood by those of ordinary skill in the art. The terms "face" and "facing" mean that a first element may directly or indirectly oppose a second element. In a case in which a third element intervenes between the first and second element, the first and second element may be understood as being indirectly opposed to one another, although still facing each other. When an element is described as 'not overlapping' or 'to not overlap' another element, this may include that the elements are spaced apart from each other, offset from each other, or set aside from each other or any other suitable term as would be appreciated and understood by those of ordinary skill in the art.

When an embodiment may be implemented differently, a specific process order may be performed differently from the described order. For example, two consecutively described processes may be performed substantially at the same time or performed in an order opposite to the described order.

It will be understood that when a layer, region, or component is referred to as being "connected" or "coupled" to another layer, region, or component, it may be "directly connected" or "directly coupled" to the other layer, region, or component and/or may be "indirectly connected" or "indirectly coupled" to the other layer, region, or component with other layers, regions, or components interposed therebetween. For example, it will be understood that when a layer, region, or component is referred to as being "electrically connected" to another layer, region, or component, it may be "directly electrically connected" to the other layer, region, or component and/or may be "indirectly electrically connected" to the other layer, region, or component with other layers, regions, or components interposed therebetween.

Also, when an element is referred to as being "in contact" or "contacted" or the like to another element, the element may be in "electrical contact" or in "physical contact" with another element; or in "indirect contact" or in "direct contact" with another element.

"About" or "approximately" as used herein is inclusive of the stated value and means within an acceptable range of deviation for the particular value as determined by one of ordinary skill in the art, considering the measurement in question and the error associated with measurement of the particular quantity (i.e., the limitations of the measurement system). For example, "about" may mean within one or more standard deviations, or within ±30%, 20%, 10%, 5% of the stated value.

In the following examples, the x-axis, the y-axis and the z-axis are not limited to three axes of the rectangular coordinate system, and may be interpreted in a broader sense. For example, the x-axis, the y-axis, and the z-axis may be perpendicular to one another, or may represent different directions that may not be perpendicular to one another.

As used herein, the term "unit" denotes a structure or element as illustrated in the drawings and as described in the specification. However, the disclosure is not limited thereto. The term "unit" is not to be limited to that which is illustrated in the drawings.

Unless otherwise defined, all terms (including technical and scientific terms) used herein have the same meaning as commonly understood by one of ordinary skill in the art to which embodiments pertain. In addition, it will be further understood that terms, such as those defined in commonly-used dictionaries, should be interpreted as having a meaning that is consistent with their meaning in the context of the relevant art and will not be interpreted in an idealized or overly formal sense unless expressly so defined herein.

A display device according to an embodiment may be an apparatus displaying an image or images and may include liquid crystal displays, electrophoretic displays, organic light-emitting displays, inorganic light-emitting displays, field emission displays, surface-conduction electron-emitter displays, plasma displays, cathode ray displays, and quantum dot light-emitting displays. For example, an emission layer of a display element provided to the display device 1 may include an organic material, may include an inorganic material, may include quantum dots, may include an organic material and quantum dots, or may include an inorganic material and quantum dots. However, the disclosure is not limited thereto.

Hereinafter, though an organic light-emitting display device may be described as an example as a display device according to an embodiment, the display device according to an embodiment is not limited thereto and may include various types of display devices.

Figure 2A:
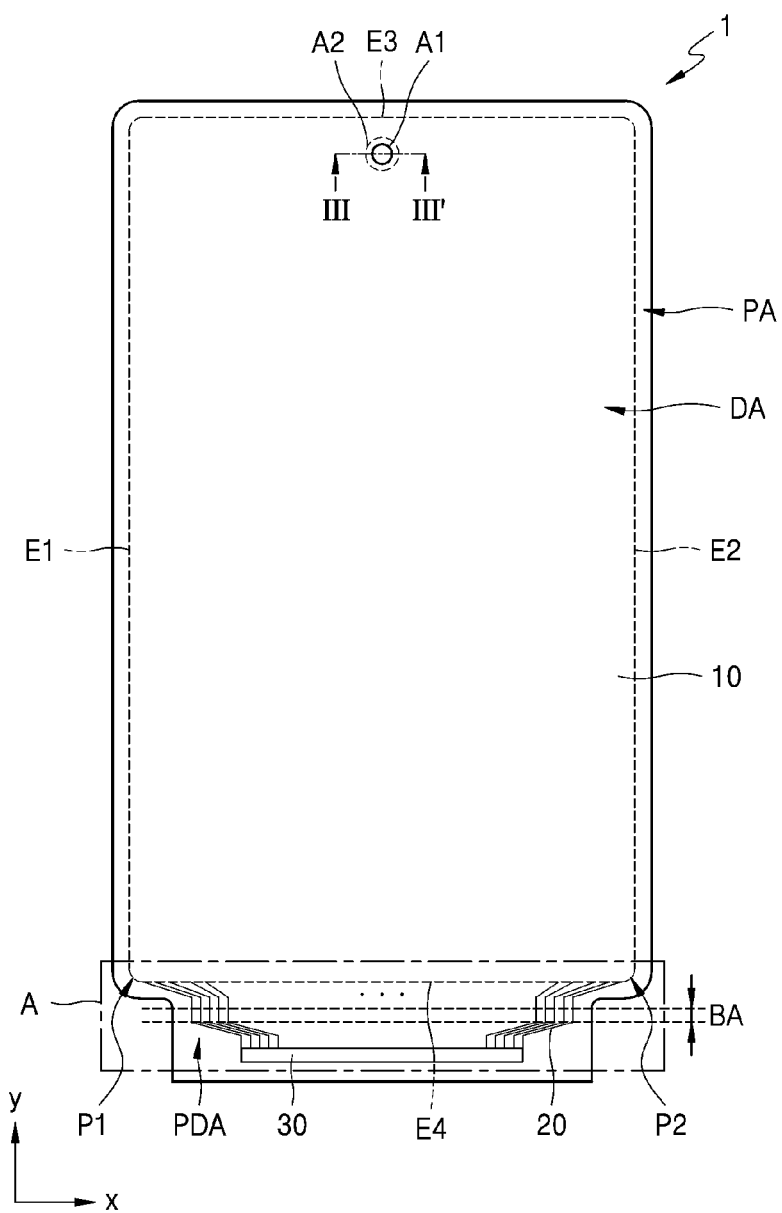
FIGS. 2A and 2B are plan views of a portion or region of a display device according to an embodiment.
Figure 2B:
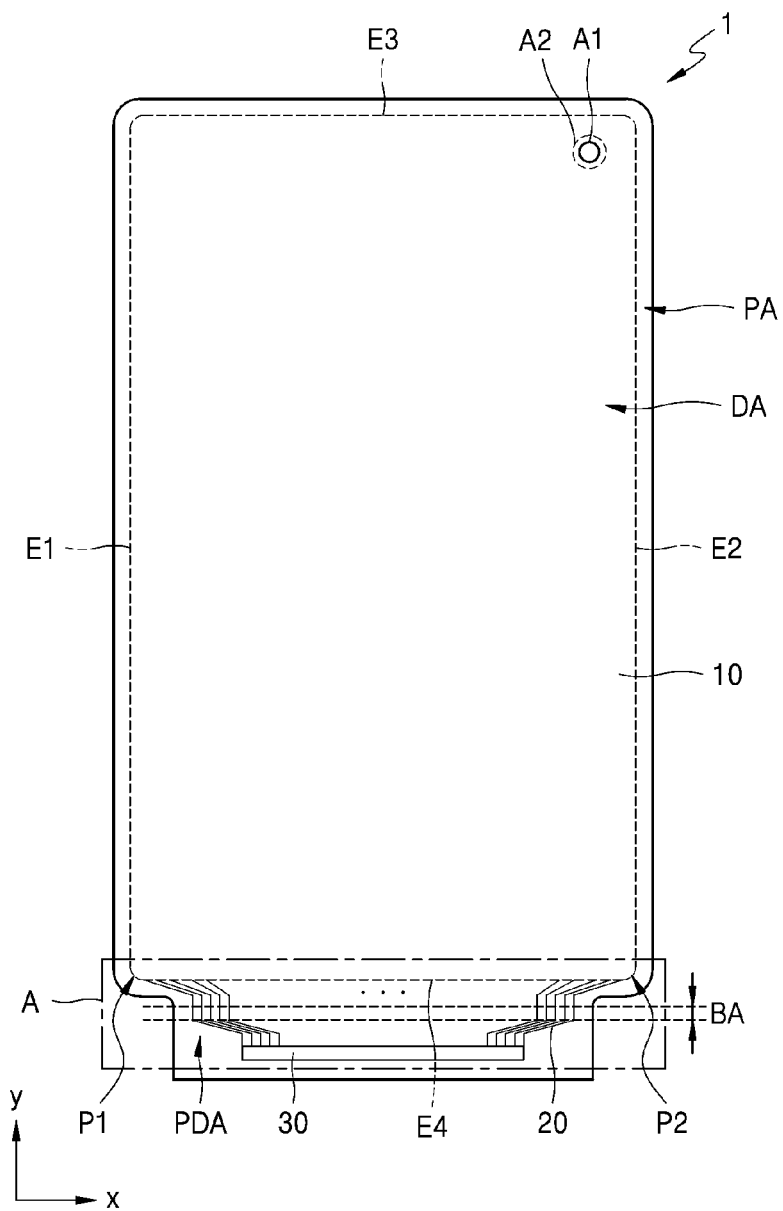

FIG. 1 is a perspective view of a portion or a region of a display device 1 according to an embodiment, and FIGS. 2A and 2B are plan views of a portion or a region of the display device 1 according to an embodiment.

Referring to FIG. 1, a substrate 100 of the display device 1 may include a display area DA and a peripheral area PA outside the display area DA. The peripheral area PA may include a bent area BA in which a portion thereof may be bent. The rest of the regions except for the bent area BA in the substrate 100 may be a region or regions having an approximately flat surface. The bent area BA of the substrate 100 may be bent around a bending axis BAX extending in an x-direction as shown in FIG. 1.

The substrate 100 may include various flexible, bendable, or rollable materials. For example, the substrate 100 may include a polymer resin such as polyethersulfone, polyacrylate, polyetherimide, polyethylene naphthalate, polyethylene terephthalate, polyphenylene sulfide, polyarylate, polyimide, polycarbonate, and cellulose acetate propionate.

The substrate 100 may have a multi-layered structure including two layers including the polymer resin and a barrier layer including an inorganic material therebetween, the inorganic material may include silicon oxide, silicon nitride, and silicon oxynitride. Various modifications may be made, however. In an embodiment, in the case of a display device in which the substrate 100 may not be bent, the substrate 100 may include a glass material.

In the substrate 100, a width of the peripheral area PA including the bent area BA may be less than a width of a portion in which the display area DA may be located or disposed. A corner portion 100c of an edge of the substrate 100 may have a substantially round shape. This shape may be applicable to the display area DA. As shown in FIGS. 2A and 2B, a corner portion of the display area DA may have a substantially round shape along the shape of the corner portion 100c of the substrate 100.

A first area A1 and a second area A2 may be located or disposed inside the display area DA, the second area A2 may surround the first area A1. In an embodiment, the first area A1 may include a transmission area through which light may pass, and the second area A2 outside the first area A1 may include a non-display area in which a pixel may not be arranged or disposed. In an embodiment, in the case where light passes through the first area A1, a light transmittance thereof may be about 50% or more, about 70% or more, about 75% or more, about 80% or more, about 85% or more, or about 90% or more. The first area A1 may include a region in which a component may be arranged or disposed on a side of the substrate 100. The first area A1 may have various schematic cross-sectional structures as shown in FIGS. 3A to 3D and 4A to 4C.

Referring to FIGS. 2A and 2B, the display device 1 may include the display area DA in which pixels may be located or disposed, and the peripheral area PA as shown in FIG. 1, the peripheral area PA being located or disposed outside or adjacent to the display area DA. The peripheral area PA may include a pad area PDA on a side of the display area DA, the pad area PDA being a region on which various kinds of electronic elements such as, for example, an integrated circuit IC, or a printed circuit board may be electrically attached.

FIGS. 2A and 2B may be understood as plan views of the substrate 100 in a manufacturing process. In a final display device or an electronic apparatus such as smartphones including a display device, a portion of the substrate 100 may be bent as in FIG. 1 to minimize the area of the peripheral area PA recognized by a user. For example, as shown in FIGS. 1 and 2A (or FIG. 2B), the substrate 100 may include portions having different widths in the x-direction. For example, the substrate 100 may be bent around the bending axis BAX parallel to the x-direction in the portion having a narrow width.

In this case, at least a portion of the pad area PDA may overlap the display area DA. The bending direction may be set such that the pad area PDA may not indicate the display area DA and may be located or disposed behind the display area DA. Therefore, a user may recognize that the display area DA occupies most of the display device 1.

The edges of the display area DA may have a shape substantially similar to an edge of a rectangle or a square as a whole. As an example, the display area DA may include a first edge E1, a second edge E2, a third edge E3, and a fourth edge E4, the first edge E1 and the second edge E2 may face each other, and the third edge E3 and the fourth edge E4 may face each other and may be located or disposed between the first edge E1 and the second edge E2. The pad area PDA may neighbor the fourth edge E4 among the first edge E1 to the fourth edge E4. In this case, a first portion P1 connecting the first edge E1 to the fourth edge E4 may have a substantially round shape. The display area DA may have a substantially round shape also at a second portion P2 connecting the second edge E2 to the fourth edge E4. The display area DA may have a substantially round shape at other edges thereof.

A display unit 10 may be arranged or disposed in the display area DA, the display unit 10 may include pixels. A fan-out unit 20 to which conductive lines may extend may be arranged or disposed in the pad area PDA. A side of the fan-out unit 20 may be electrically connected to the display unit 10, and another side of the fan-out unit 20 may be electrically connected to a driving circuit unit 30. The driving circuit unit 30 may include various kinds of electronic devices such as an integrated circuit IC, for example. It is to be understood that the fan-out unit 20 may also be referred to as a fan-out structure.

The first area A1 and the second area A2 may be located or disposed inside the display area DA, the second area A2 may surround the first area A1. As shown in FIG. 2A, the first area A1 may be located or disposed on or near a top center of the display area DA. In an embodiment, as shown in FIG. 2B, the first area A1 may be located or disposed on a side, for example, the top right of the display area DA. Though it is shown in FIGS. 2A and 2B that one first area A1 may be provided and is shown in a circle, two or more first areas A1 may be provided and the second area A2 may have a substantially ellipse shape surrounding the first area A1 in an embodiment.

FIGS. 3A to 3D are schematic cross-sectional views of the display device 1 according to an embodiment, taken along line III-III' of FIG. 2A.

Figure 3A:
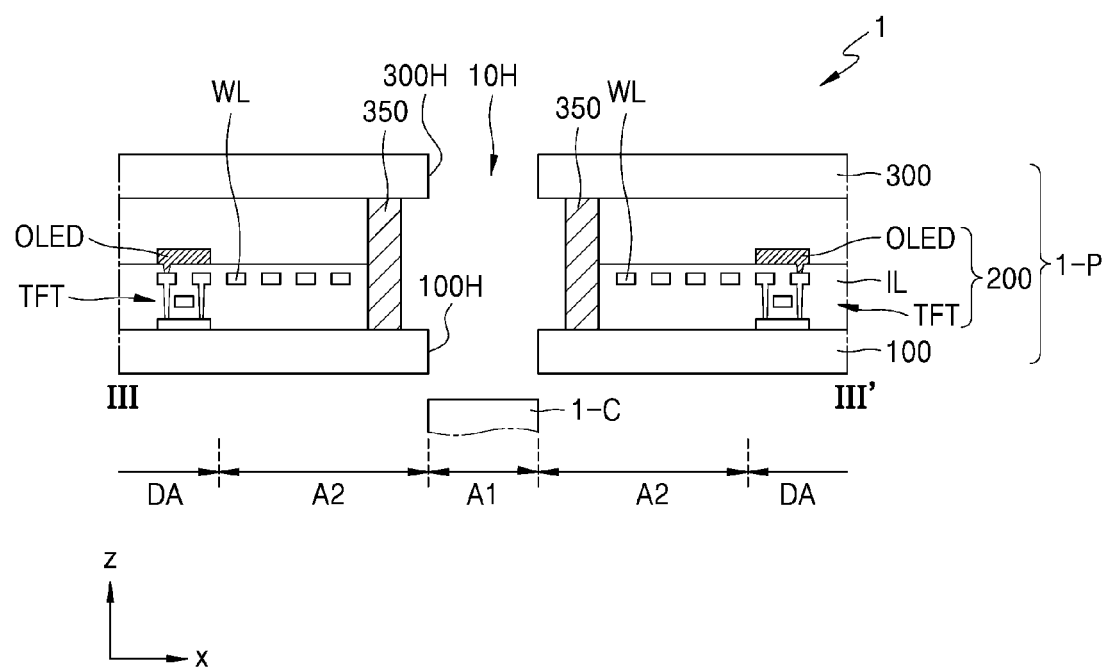
FIGS. 3A to 3D are schematic cross-sectional views of a display device according to an embodiment.

Referring to FIG. 3A, the display device 1 may include a display panel 1-P and a component 1-C, the display panel 1-P including a display element, and the component 1-C corresponding to the first area A1.

The display panel 1-P may include the substrate 100, an encapsulation substrate 300, and a display element layer 200, the encapsulation substrate 100 being an encapsulation member that may face the substrate 100, and the display element layer 200 being arranged or disposed between the substrate 100 and the encapsulation substrate 300. A sealing material 350 (for example, a sealant) may be arranged or disposed between the substrate 100 and the encapsulation substrate 300, the sealing material 350 covering or overlapping a lateral side of the display element layer 200. Though it is shown in FIG. 3A that the sealing material 350 may be arranged or disposed on two opposite sides of the first area A1, it may be understood that the first area A1 may be entirely surrounded by the sealing material 350 when viewed in a direction perpendicular to a main surface of the substrate 100.

The substrate 100 may have a multi-layered structure including a layer including a polymer resin and an inorganic layer (not shown). The encapsulation substrate 300 may include glass or a polymer resin.

Figure 9:
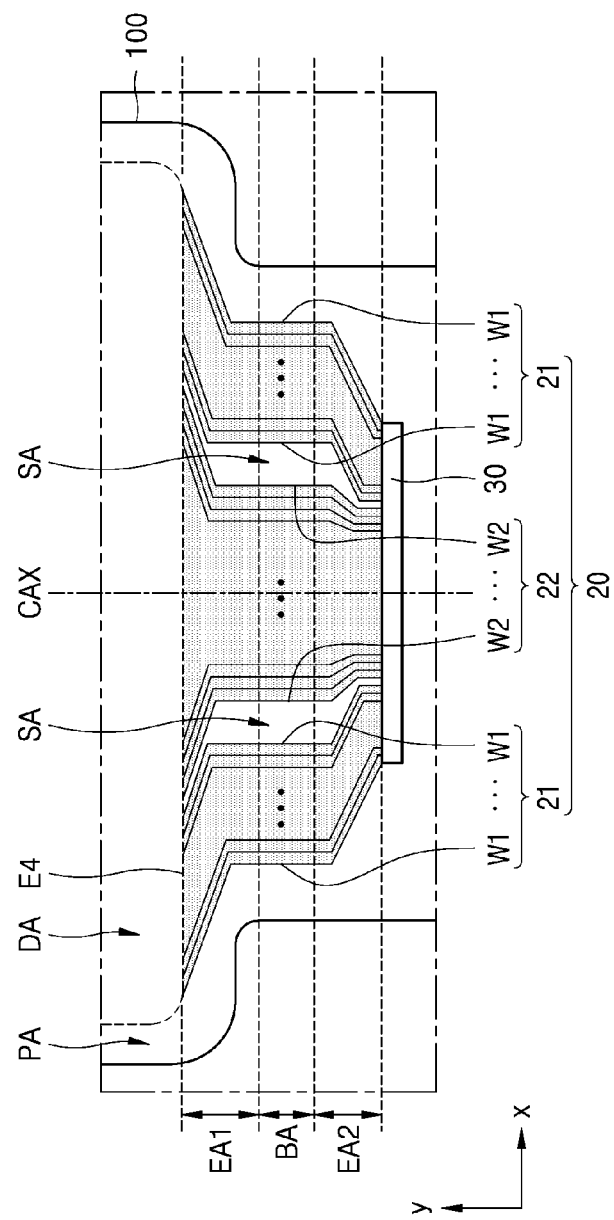
FIG. 9 is an enlarged plan view of region A of FIG. 2A and FIG. 2B.

The display element layer 200 may include a circuit layer, an organic light-emitting diode OLED, and an insulating layer IL therebetween, the circuit layer including a thin film transistor TFT, and the organic light-emitting diode OLED being a display element electrically connected to the thin film transistor. The thin film transistor TFT and the organic light-emitting diode OLED electrically connected thereto may be arranged or disposed in the display area DA, and some or a predetermined number of wirings WL of the display element layer 200 may be located or disposed in a first extension area EA1 (as shown in FIG. 9) and the second area A2. The wirings WL may provide a predetermined signal or voltage to pixels that are apart from each other with the first area A1 therebetween. Though it is shown in FIG. 3A that the wirings WL may not overlap the sealing material 350 in the display area DA and the second area A2, a portion of the sealing material 350 may be arranged or disposed also on the wirings WL in an embodiment.

The display panel 1-P may include a through hole 10H corresponding to the first area A1. For example, the substrate 100 and the encapsulation substrate 300 may respectively include through holes 100H and 300H each corresponding to the first area A1. The display element layer 200 may include a through hole corresponding to the first area A1.

Though not shown, elements such as an input sensing member, a reflection prevention member, and a transparent window may be arranged or disposed on the display panel 10, the input sensing member may sense a touch input, and the reflection prevention member may include a polarizer and a retarder, or a color filter and a black matrix.

The component 1-C may be located or disposed in the first area A1. The component 1-C may include an electronic element that may use light or sound. For example, the electronic element may be a sensor such as an infrared sensor that may emit and/or receive light, a camera that may receive light to capture an image, a sensor that may output and sense light or sound to measure a distance or recognize a fingerprint, a small lamp that may output light, and a speaker that may output sound. The electronic element that uses light may use light in various wavelength bands including visible light, infrared light, and ultraviolet light. As shown in FIG. 3A, in the case where the display panel 1-P may include the through hole 10H corresponding to the first area A1, light or sound that may be output from or received by an electronic element may be more effectively utilized.

Figure 3B:
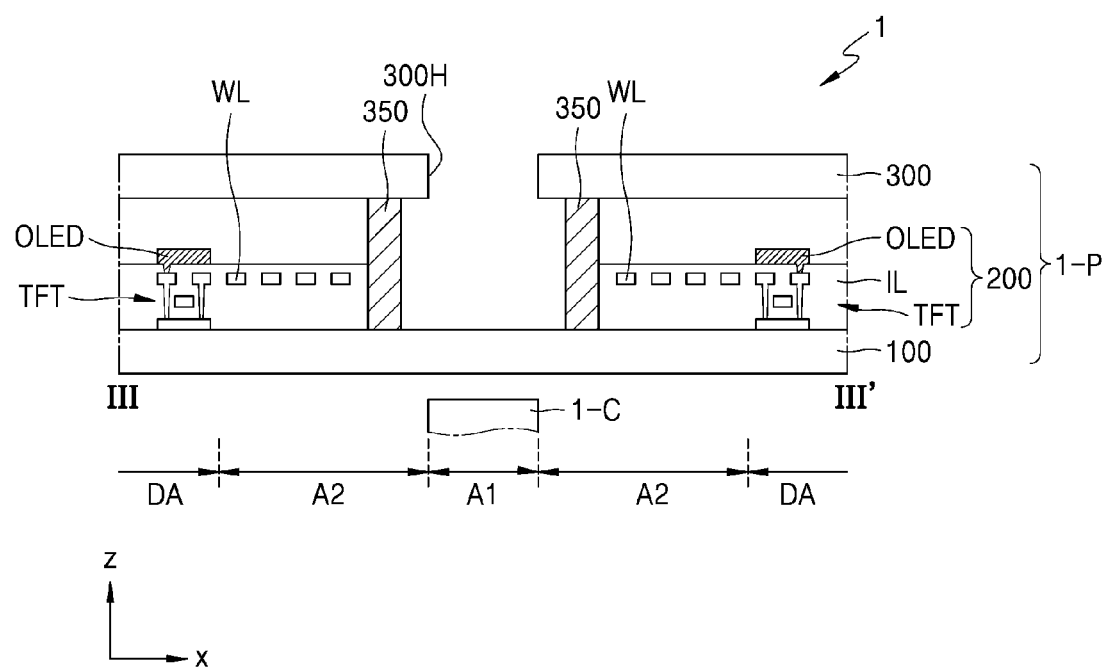

Different from an embodiment in which the display panel 1-P may include the through hole 10H corresponding to the first area A1 in FIG. 3A, the display panel 1-P may not include a through hole. For example, as shown in FIG. 3B, though the encapsulation substrate 300 may include the through hole 300H corresponding to the first area A1, the substrate 100 may not include a through hole.

Figure 3C:
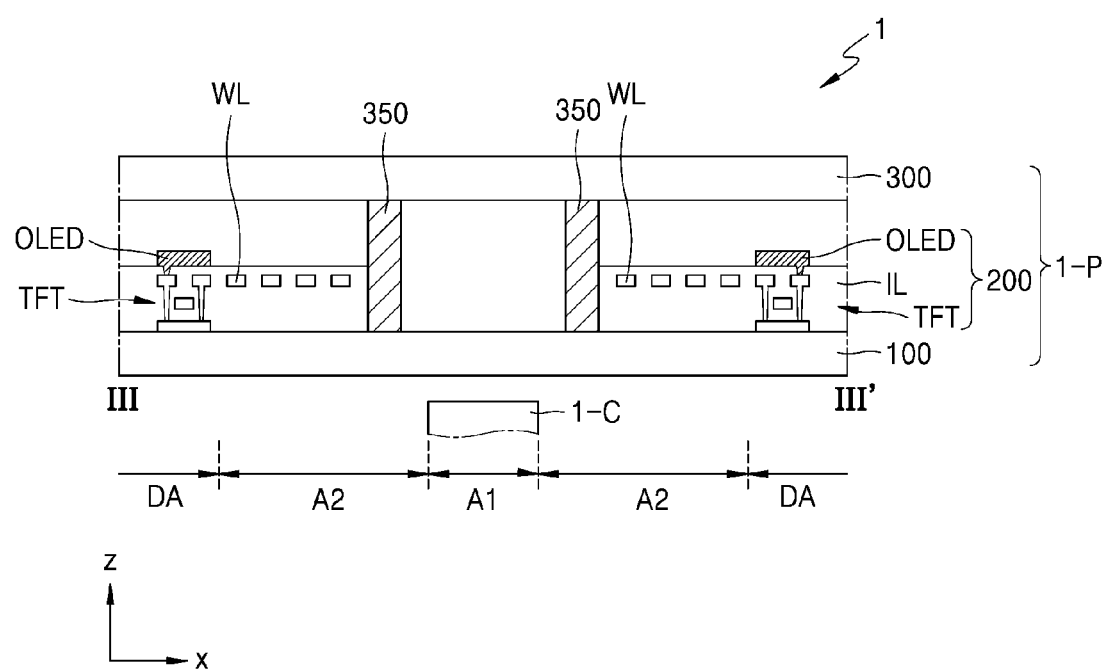
Figure 3D:
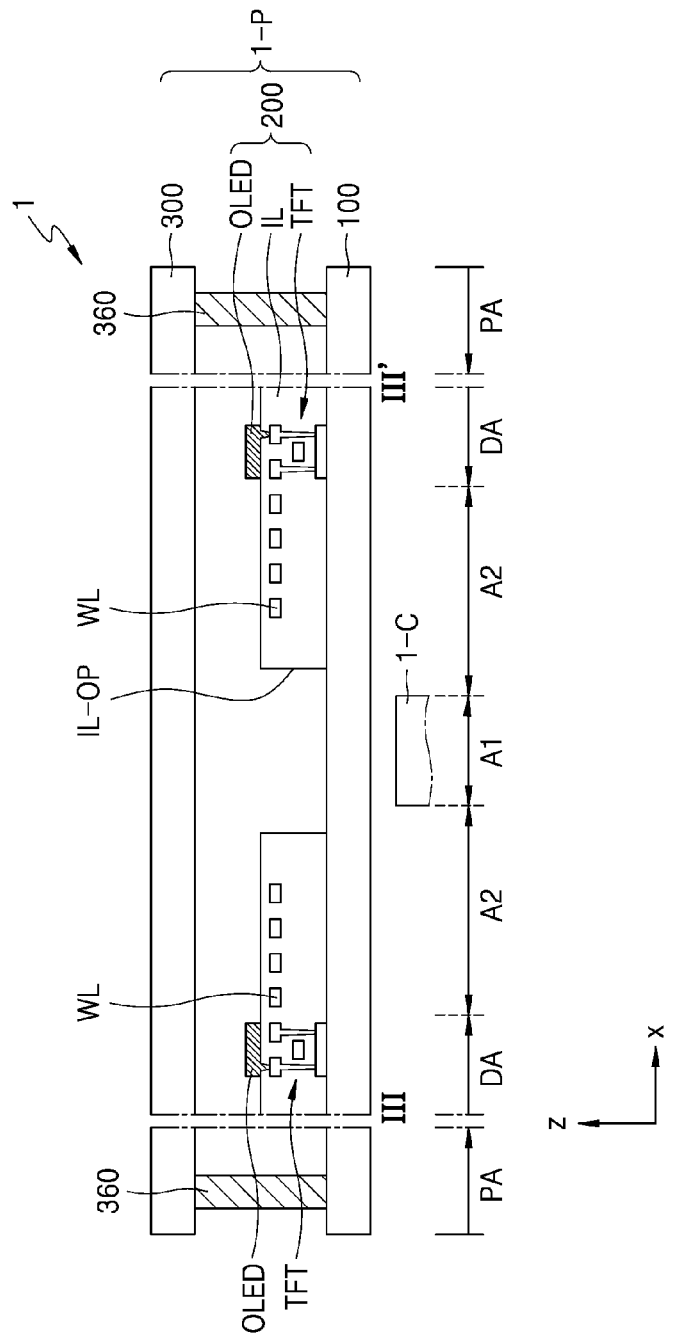

Alternatively, as shown in FIGS. 3C and 3D, both the substrate 100 and the encapsulation substrate 300 may not include a through hole. In FIG. 3C, the sealing material 350 may be arranged or disposed in the second area A2 to surround the first area A1.

Different from that of FIG. 3C, the sealing material 350 may not be provided around the first area A1 in FIG. 3D. A sealing material 360 may be located or disposed in the peripheral area PA and may seal the display element layer 200 from external air by bonding the substrate 100 to the encapsulation substrate 300. Though not shown, in the display device 1 of FIGS. 3A to 3C, the sealing material 360 may be provided or disposed to surround the display area DA.

The insulating layer IL of FIG. 3D may include an opening IL-OP corresponding to the first area A1. In an embodiment, any element may not be arranged or disposed in a region between the substrate 100 and the encapsulation substrate 300, the region corresponding to the first area A1. In an embodiment, a portion of inorganic insulating layer(s) such as a buffer layer may remain in the first area A1 of the substrate 100.

As shown in FIGS. 3B to 3D, even though the substrate 100 may not include the through hole 100H, while portions of the display element layer 200 that correspond to the first area A1 are removed, a light transmittance of an electronic element may be secured. In the case where the display device 1 may include the display panel 1-P shown in FIGS. 3B to 3D, it may be appropriate to use an electronic element that uses light as an electronic element.

Though it is shown in FIGS. 3A to 3D that the component 1-C may be located or disposed below the display panel 1-P, for example, on one side of the substrate 100, at least a portion of the component 1-C may be inserted to an inner surface of the through hole 10H to overlap a lateral surface of the display panel 1-P defining the through hole 10H in FIG. 3A.

The component 1-C may include a member other than the above-described electronic element. In an embodiment, in the case where the display panel 1-P is used as a smartwatch or an instrument panel for a vehicle, the component 1-C may be a member such as clock hands or a needle indicating predetermined information (for example the velocity of a vehicle, and other measurable information). Alternatively, the component 1-C may include an element such as an accessory that may increase the aesthetic sense of the display panel 1-P.

Figure 4A:
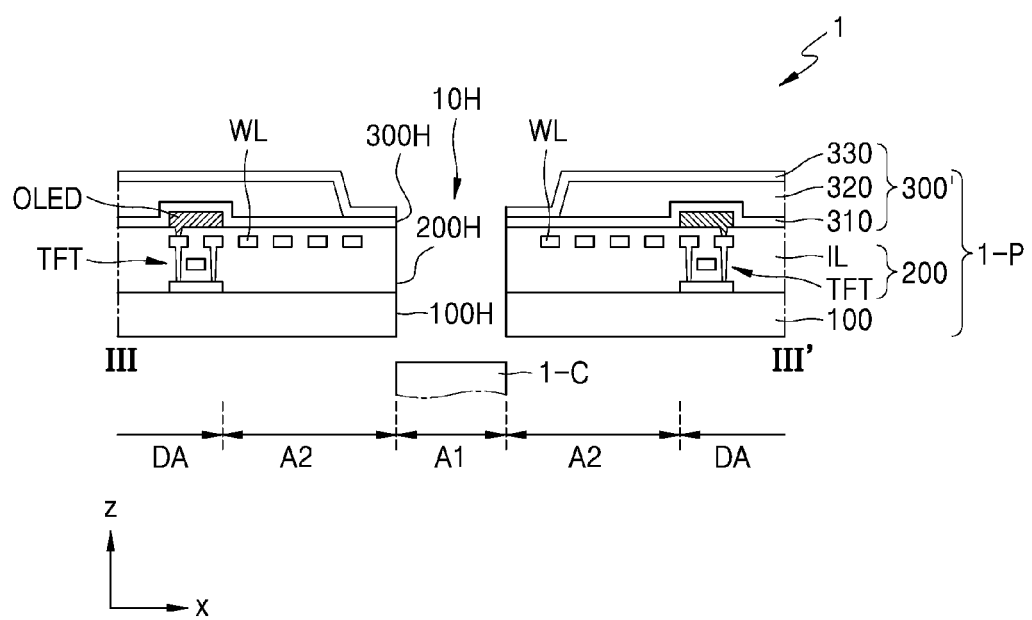
FIGS. 4A to 4C are schematic cross-sectional views of a display device according to an embodiment.
Figure 4B:
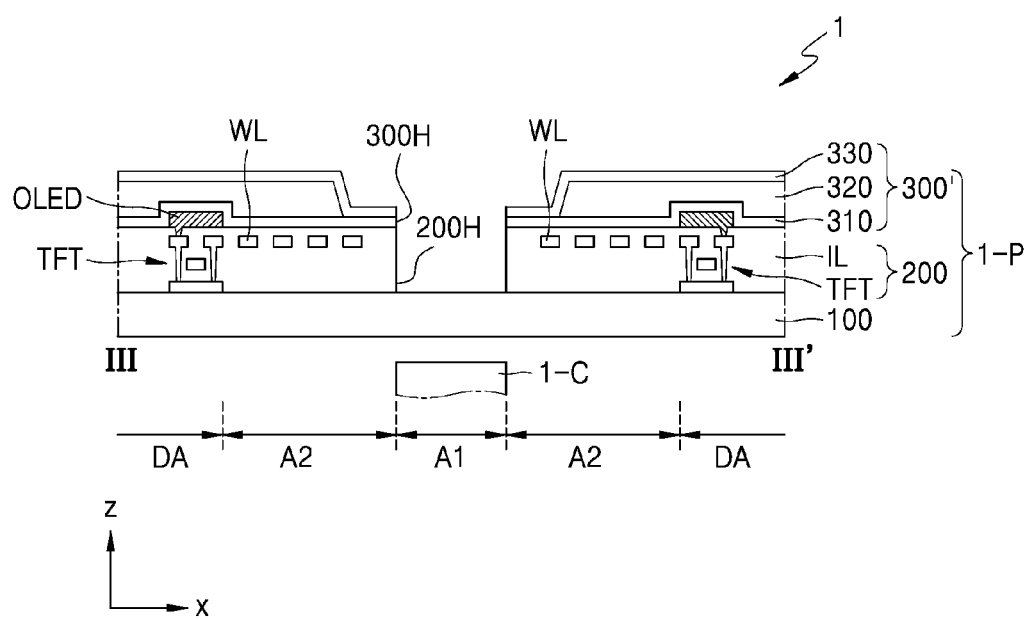
Figure 4C:
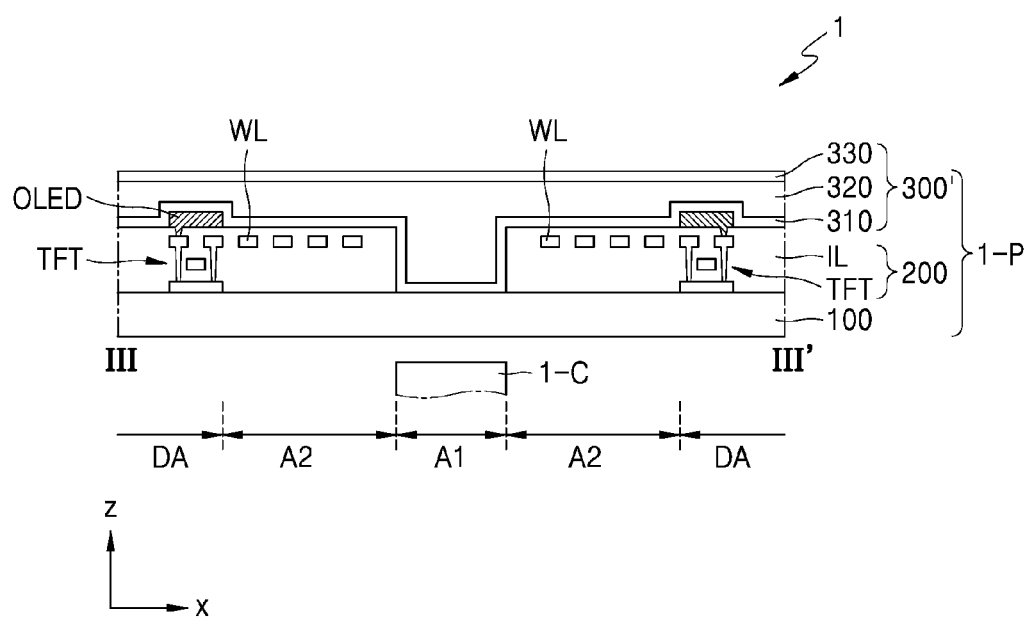

FIGS. 4A to 4C are schematic cross-sectional views of the display device 1 taken along line III-III' of FIG. 2A according to embodiments.

Different from the display panel 1-P described with reference to FIG. 3A and including the encapsulation substrate 300 as an encapsulation member and the sealing material 350, the display panel 1-P according to an embodiment may include a thin-film encapsulation layer 300' as an encapsulation member. In this case, the flexibility of the display panel 1-P may be improved. Hereinafter, a difference is mainly described, for convenience of description.

The thin-film encapsulation layer 300' may include at least one inorganic encapsulation layer and at least one organic encapsulation layer. With regard to this, FIG. 4A shows first and second inorganic encapsulation layers 310 and 330, and an organic encapsulation layer 320 therebetween.

The first inorganic encapsulation layer 310 and the second inorganic encapsulation layer 330 may include at least one inorganic insulating material among aluminum oxide, titanium oxide, tantalum oxide, hafnium oxide, zinc oxide, silicon oxide, silicon nitride, and silicon oxynitride. The organic encapsulation layer 320 may include a polymer-based material. The polymer-based material may include an acryl-based resin, an epoxy-based resin, polyimide, and polyethylene.

The display panel 1-P may include the through hole 10H corresponding to the first area A1. For example, the substrate 100, the display element layer 200, and the thin-film encapsulation layer 300' may respectively include through holes 100H, 200H, and 300H each corresponding to the first area A1. The first inorganic encapsulation layer 310, the second inorganic encapsulation layer 330, and the organic encapsulation layer 320 each may include a hole corresponding to the first area A1. A size of the hole of the organic encapsulation layer 320 may be greater than sizes of the holes of the first and second inorganic encapsulation layers 310 and 330. The first inorganic encapsulation layer 310 may contact the second inorganic encapsulation layer 330 in the surroundings of the first area A1.

Different from the display panel 1-P including the through hole 10H corresponding to the first area A1 in FIG. 3A, the display panel 1-P may not include the through hole. As shown in FIG. 4B, the display element layer 200 and the thin-film encapsulation layer 300' may respectively include the through holes 200H and 300H each corresponding to the first area A1, but the substrate 100 may not include a through hole.

Alternatively, as shown in FIG. 4C, all of the substrate 100, the display element layer 200, and the thin-film encapsulation layer 300' may not include the through hole corresponding to the first area A1. As shown in FIGS. 4B and 4C, even though the substrate 100 may not include the through hole 100H, while portions of the display element layer 200 that may correspond to the first area A1 are removed, a light transmittance of an electronic element, which is the component 1-C, may be secured as described above.

In the case where the thin-film encapsulation layer 300' may not include the through hole as shown in FIG. 4C, at least one inorganic encapsulation layer and at least one organic encapsulation layer each may cover or overlap the substrate 100 in the first area A1. In this case, a portion of the display element layer 200 that may correspond to the first area A1 between the substrate 100 and the thin-film encapsulation layer 300' may be removed. Though it is shown in FIG. 4A that all of the insulating layer IL corresponding to the first area A1 may be removed, only some layers of the insulating layer IL, which may be a multi-layer, may be removed in an embodiment.

Though it is shown in FIGS. 4A to 4C that the component 1-C may be located or disposed below the display panel 1-P, for example, on a side of the substrate 100, at least a portion of the component 1-C may be inserted to an inner surface of the through hole 10H to overlap a lateral surface of the display panel 1-P defining the through hole 10H in an embodiment of FIG. 4A.

Figure 5:
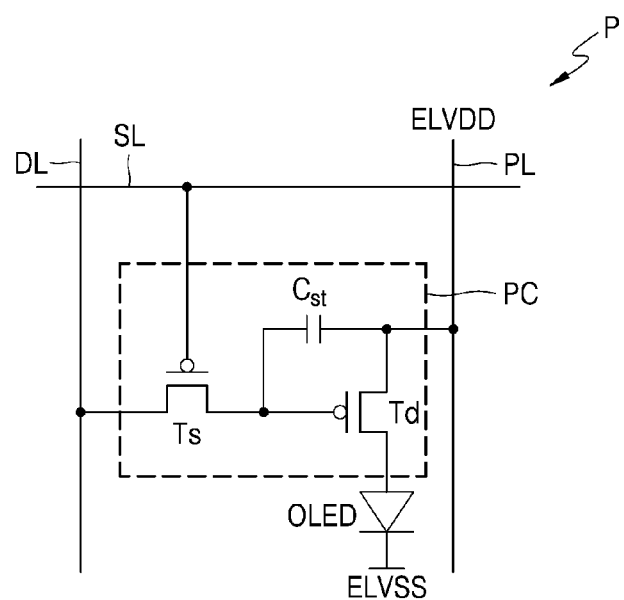
FIG. 5 is an equivalent circuit diagram of a pixel of a display device according to an embodiment.

FIG. 5 is an equivalent circuit diagram of a pixel of the display device 1 according to an embodiment.

Referring to FIG. 5, a pixel P may include a pixel circuit PC and an organic light-emitting diode OLED electrically connected to the pixel circuit PC, the pixel circuit being electrically connected to a scan line SL and a data line DL. The pixel circuit PC may include a driving thin film transistor Td, a switching thin film transistor Ts, and a storage capacitor Cst. The switching thin film transistor Ts may be electrically connected to the scan line SL and the data line DL and may transfer a data signal transferred through the data line DL to the driving thin film transistor Td in response to a scan signal input through the scan line SL.

The storage capacitor Cst may be electrically connected to the switching thin film transistor Ts and the driving thin film transistor Td and may store a voltage corresponding to a difference between a voltage transferred from the switching thin film transistor Ts and a driving voltage ELVDD supplied to a driving voltage line PL. The driving voltage ELVDD and a second power source ELVSS may have a potential difference that may allow the organic light-emitting diode OLED to emit light.

The driving thin film transistor Td may be electrically connected to the driving voltage line PL and the storage capacitor Cst and may control a driving current flowing through the organic light-emitting diode OLED from the driving voltage line PL in response to the voltage stored in the storage capacitor Cst. The organic light-emitting diode OLED may emit light having a predetermined brightness by using the driving current. The organic light-emitting diode OLED may emit, for example, red, green, blue, or white light.

Although FIG. 5 illustrates the case where a pixel P includes two thin film transistors and one storage capacitor, an embodiment is not limited thereto. In an embodiment, the pixel circuit PC of the pixel P may include three or more thin film transistors or two or more storage capacitors. Thus, various modifications may be made. For example, the pixel circuit PC of the pixel P may include seven thin film transistors and one storage capacitor.

Figure 6:
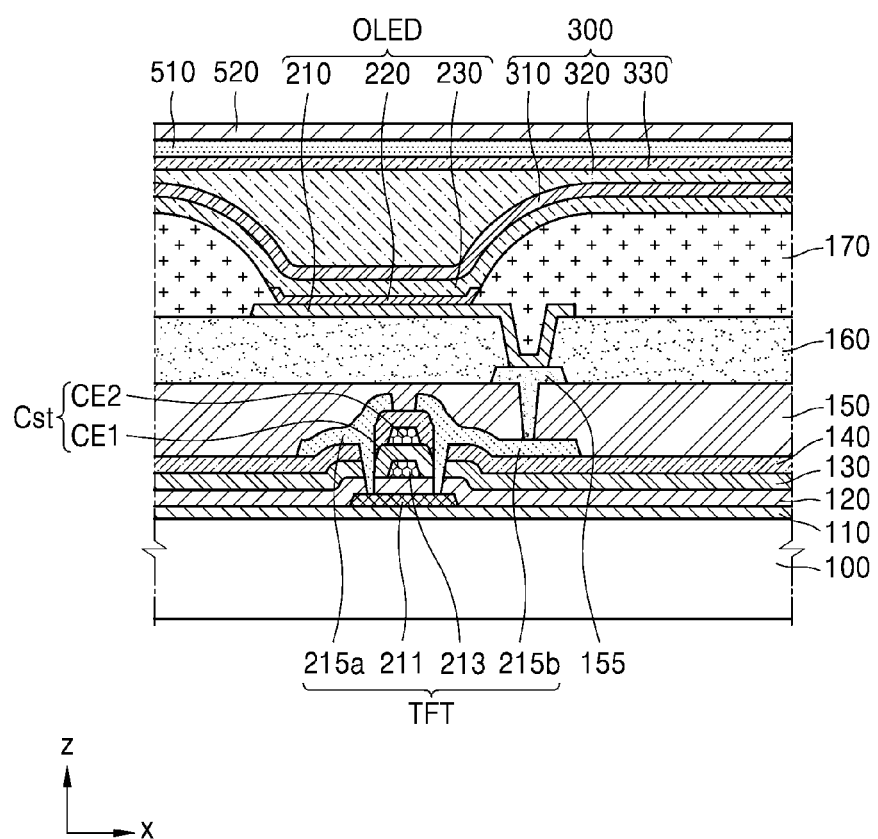
FIG. 6 is a schematic cross-sectional view of a pixel according to an embodiment.

FIG. 6 is a schematic cross-sectional view of a pixel according to an embodiment.

Referring to FIG. 6, a display element such as the organic light-emitting diode OLED and the thin film transistor TFT to which the organic light-emitting diode OLED may be electrically connected may be located or disposed in the display area DA. Electric connection of the organic light-emitting diode OLED to the thin film transistor TFT may be understood that a pixel electrode 210 may be electrically connected to the thin film transistor TFT. Though it is shown in FIG. 6 that the pixel electrode 210 may be electrically connected to the thin film transistor TFT through a connection metal 155, the connection metal 155 may be omitted in an embodiment.

There may be a case that a thin film transistor (not shown) may be arranged or disposed even in a peripheral area PA outside the display area DA of the substrate 100. A thin film transistor located or disposed in the peripheral area PA may be a portion of a circuit unit that may control an electric signal applied into, for example, the display area DA.

A buffer layer 110 may be arranged or disposed on the substrate 100 over which a thin film transistor TFT may be formed or disposed. The buffer layer 110 may include an inorganic material such as silicon oxide, silicon nitride, and/or silicon oxynitride. The buffer layer 110 may heighten a top surface of the substrate 100 or prevent or minimize the penetration of impurities from the substrate 100 into a semiconductor layer 211 of the thin film transistor TFT.

The thin film transistor TFT may include a semiconductor layer 211, a gate electrode 213, a source electrode 215*a*, and a drain electrode 215*b*, the semiconductor layer 211 may include amorphous silicon, polycrystalline silicon, an organic semiconductor material, or an oxide semiconductor material.

To secure the insulation between the semiconductor layer 211 and the gate electrode 213, a gate insulating layer 120 may be arranged or disposed between the semiconductor layer 211 and the gate electrode 213, the gate insulating layer 120 may include an inorganic material such as silicon oxide, silicon nitride, and/or silicon oxynitride.

A first interlayer insulating layer 130 and a second interlayer insulating layer 140 may be arranged or disposed on the gate electrode 213, the first interlayer insulating layer 130 and the second interlayer insulating layer 140 may include an inorganic material such as silicon oxide, silicon nitride, and/or silicon oxynitride. The source electrode 215*a* and the drain electrode 215*b* may be arranged or disposed on the second interlayer insulating layer 140. The insulating layers including an inorganic material may be formed by chemical vapor deposition (CVD) or atomic layer deposition (ALD), by way of example. This may be applied to embodiments below and modifications thereof.

A top electrode CE2 may be located or disposed over the gate electrode 213 with the first interlayer insulating layer 130 therebetween. In an embodiment, a portion of the gate electrode 213 may serve as a bottom electrode CE1. The bottom electrode CE1 and the top electrode CE2 may constitute the storage capacitor Cst.

A first planarization layer 150 and a second planarization layer 160 may be arranged or disposed on the thin film transistor TFT. The connection metal 155 may be arranged or disposed on the first planarization layer 150. The thin film transistor TFT may be electrically connected to the pixel electrode 210 through the connection metal 155. The first planarization layer 150 and the second planarization layer 160 may approximately or substantially planarize a top surface of the thin film transistor TFT.

The first planarization layer 150 and the second planarization layer 160 may include an organic material such as benzocyclobutene (BCB) or hexamethyldisiloxane (HMDSO).

The organic light-emitting diode OLED may be located or disposed on the second planarization layer 160 in the display area DA. The organic light-emitting diode OLED may include the pixel electrode 210, an opposite electrode 230, and an intermediate layer 220 therebetween, the intermediate layer 220 may include an emission layer.

A pixel-defining layer 170 may be arranged or disposed over the first planarization layer 150. The pixel-defining layer 170 may define a pixel by including an opening corresponding to each sub-pixel, for example, an opening exposing at least a central portion of the pixel electrode 210. As shown in FIG. 6, the pixel-defining layer 170 may prevent an arc, or other phenomena from occurring at the edges of the pixel electrode 210 by increasing a distance between the edges of the pixel electrode 210 and the opposite electrode 230 over the pixel electrode 210. The pixel-defining layer 170 may include an organic material such as polyimide or HMDSO.

The pixel electrode 210 may include a reflective layer including silver (Ag), magnesium (Mg), aluminum (Al), platinum (Pt), palladium (Pd), gold (Au), nickel (Ni), neodymium (Nd), iridium (Ir), chrome (Cr), or a compound thereof. In an embodiment, the pixel electrode 210 may include a layer including indium tin oxide (ITO), indium zinc oxide (IZO), zinc oxide (ZnO), indium oxide ($In_2O_3$) on/under/below the reflective layer.

The intermediate layer 220 may include a low molecular weight material or a polymer material. In the case where the intermediate layer 220 includes a low molecular weight material, although not illustrated, the intermediate layer 220 may have a structure in which a hole injection layer (HIL), a hole transport layer (HTL), an emission layer (EML), an electron transport layer (ETL), an electron injection layer (EIL), for example, may be stacked in a single or composite configuration. The intermediate layer 220 may include various organic materials such as copper phthalocyanine (CuPc), N, N'-Di (naphthalene-1-yl)-N, N'-diphenyl-benzidine (NPB), and tris-8-hydroxyquinoline aluminum (Alq3). These layers may be formed by vacuum deposition, by way of example.

In the case where the intermediate layer 220 includes a polymer material, the intermediate layer may have a structure generally including an HTL and an EML. In this case, the HTL may include poly-3, 4-ethylene dioxy thiophene (PEDOT), and the EML may include a polymer material such as a polyphenylene vinylene (PPV)-based material and a polyfluorene-based material. The intermediate layer 220 may be formed by screen printing, an inkjet printing method, and laser induced thermal imaging (LITI), however, the disclosure is not limited thereto.

The structure of the intermediate layer 220 is not limited to the above description and may have various structures. For example, the intermediate layer 220 may include one body to cover or overlap pixel electrodes 210, or include a layer patterned to correspond to each of the pixel electrodes 210.

The opposite electrode 230 may be arranged or disposed in the display area DA, and as shown in FIG. 6, the opposite electrode 230 may be arranged or disposed to cover or overlap the display area DA. For example, the opposite electrode 230 may be formed as one body over organic light-emitting diodes to correspond to the pixel electrodes 210. The opposite electrode 230 may include a conductive material having a low work function. For example, the opposite electrode 230 may include a (semi) transparent layer including silver (Ag), magnesium (Mg), aluminum (Al), platinum (Pt), palladium (Pd), gold (Au), nickel (Ni), neodymium (Nd), iridium (Ir), chrome (Cr), lithium (Li), calcium (Ca), or an alloy thereof. Alternatively, the opposite electrode 230 may include a layer including a layer including indium tin oxide (ITO), indium zinc oxide (IZO), zinc oxide (ZnO), or indium oxide ($In_2O_3$) on the (semi) transparent layer including the above materials.

Since the organic light-emitting diode OLED may be easily damaged by external moisture or oxygen, the thin-film encapsulation layer 300 may cover or overlap and protect the organic light-emitting diode OLED. The thin-film encapsulation layer 300 may cover or overlap the display area DA and extend to the outside of the display area DA. As shown in FIG. 6, the thin-film encapsulation layer 300 may include the first inorganic encapsulation layer 310, the organic encapsulation layer 320, and the second inorganic encapsulation layer 330.

The first inorganic encapsulation layer 310 may cover or overlap the opposite electrode 230 and include silicon oxide, silicon nitride, and/or silicon oxynitride. There may be a case that, other layers such as a capping layer may be arranged or disposed between the first inorganic encapsulation layer 310 and the opposite electrode 230. Since the first inorganic encapsulation layer 310 may be formed along a structure thereunder, a top surface of the first inorganic encapsulation layer 310 may not be flat as shown in FIG. 6.

The organic encapsulation layer 320 may cover or overlap the first inorganic encapsulation layer 310. Different from the first inorganic encapsulation layer 310, a top surface of the organic encapsulation layer 320 may be flat. For example, the top surface of the organic encapsulation layer 320 that may correspond to the display area DA may be approximately or substantially flat. The organic encapsulation layer 320 may include polyethylene terephthalate, polyethylene naphthalate, polycarbonate, polyimide, polyethylene sulfonate, polyoxymethylene, polyarylate, hexamethyldisiloxane, an acrylic resin (for example, polymethylmethacrylate, poly acrylic acid, within the spirit and the scope of the disclosure), or an arbitrary combination thereof.

The second inorganic encapsulation layer 330 may cover or overlap the organic encapsulation layer 320 and may include silicon oxide, silicon nitride, and/or silicon oxynitride. The second inorganic encapsulation layer 330 may allow the organic encapsulation layer 320 to not be exposed to the outside by contacting the first inorganic encapsulation layer 310 in the peripheral area PA outside the display area DA.

Since the thin-film encapsulation layer 300 may include the first inorganic encapsulation layer 310, the organic encapsulation layer 320, and the second inorganic encapsulation layer 330, even when a crack occurs inside the thin-film encapsulation layer 300, such a crack may not be connected between the first inorganic encapsulation layer 310 and the organic encapsulation layer 320 or between the organic encapsulation layer 320 and the second inorganic encapsulation layer 330 through the multi-layered structure. Through this configuration, formation of a path through which external moisture or oxygen, for example penetrates into the display area DA may be prevented or minimized.

There may be a case that a process of forming a touch electrode or a touch protective layer may be performed, the touch electrode having various patterns for a touchscreen function, and the touch protective layer protecting the touch electrode.

A polarizing plate 520 may be attached or disposed on the thin-film encapsulation layer 300 by an optically clear adhesive (OCA) 510. There may be a case that a printed circuit board (not shown) or an electronic chip (not shown), for example, may be attached or disposed in the second extension area EA2 of the peripheral area PA. When there is the touch electrode or the touch protective layer disposed on the thin-film encapsulation layer 300, the optically clear adhesive 510 and the polarizing plate 520 may be located or disposed on these elements.

The polarizing plate 520 may reduce external light reflection. For example, in the case where external light passes through the polarizing plate 520 and is reflected by a top surface of the opposite electrode 230 and then passes through the polarizing plate 520 again, since the external light passes through the polarizing plate 520 twice, the phase of the external light may be changed. As a result, since the phase of the reflected light becomes different from the phase of the external light entering the polarizing plate 520, a destructive interference occurs. Consequently, external light reflection may be reduced and thus visibility may be improved.

Figure 7:
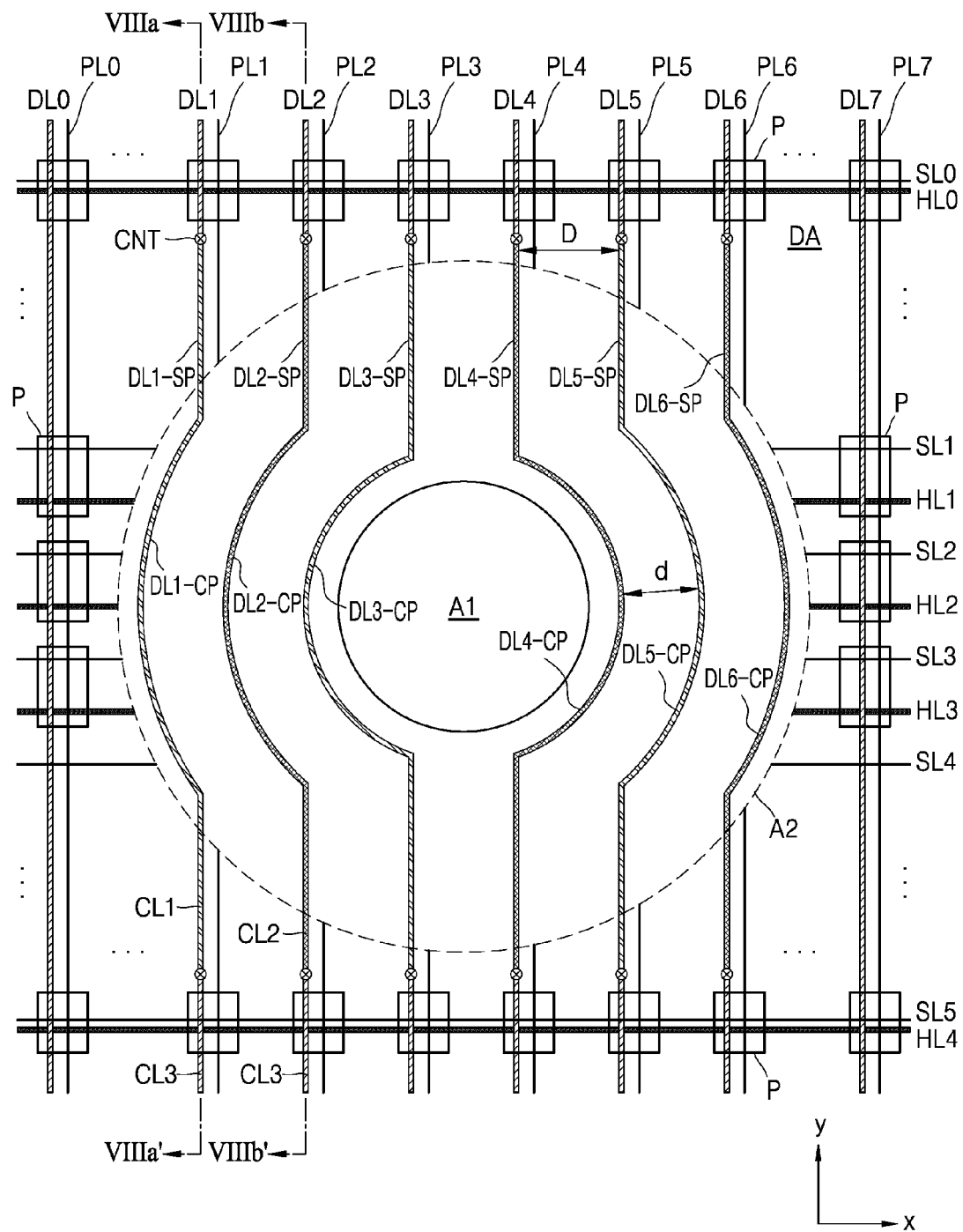
FIG. 7 is a plan view of wirings around an opening area according to an embodiment.
Figure 8A:
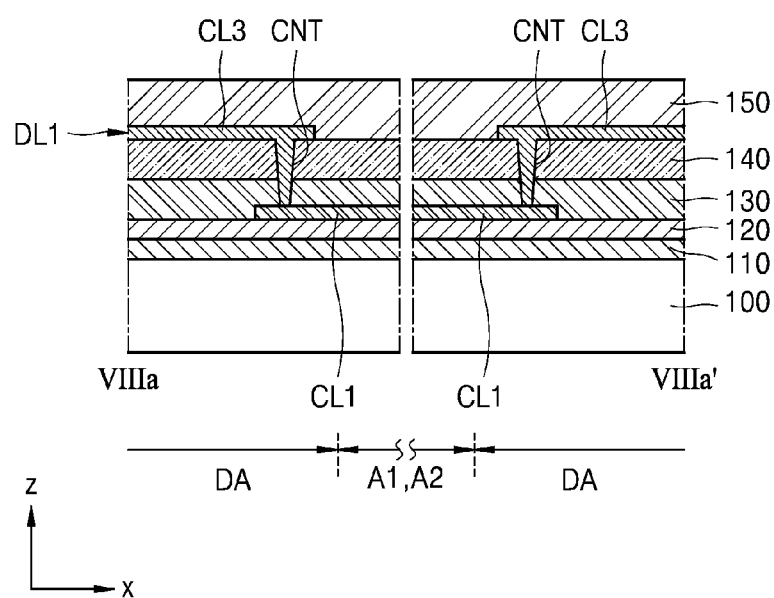
FIG. 8A is a schematic cross-sectional view of wirings taken along line VIIIa-VIIIa' of FIG. 7.
Figure 8B:
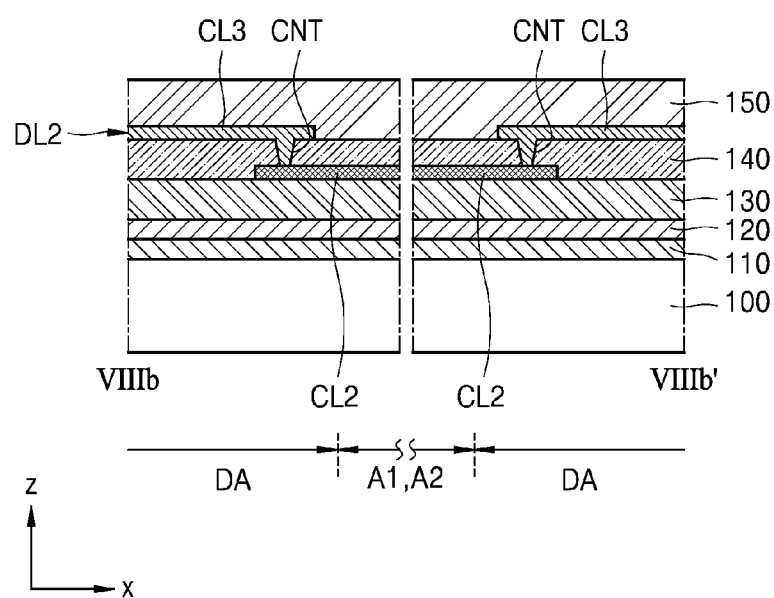
FIG. 8B is a schematic cross-sectional view taken along line VIIIb-VIIIb' of FIG. 7.

FIG. 7 is a plan view of wirings around an opening area according to an embodiment, FIG. 8A is a schematic cross-sectional view of wirings taken along line VIIIa-VIIIa' of FIG. 7, and FIG. 8B is a schematic cross-sectional view of wirings taken along line VIIIb-VIIIb' of FIG. 7.

Referring to FIG. 7, data lines DL0, DL1, DL2, DL3, DL4, DL5, DL6, and DL7 may extend in a y-direction and driving voltage lines PL0, PL1, PL2, PL3, PL4, PL5, PL6, and PL7 may extend in the y-direction. Some or a predetermined number of driving voltage lines PL0 and PL7 among the driving voltage lines PL0, PL1, PL2, PL3, PL4, PL5, PL6, and PL7 may continuously extend to pass across the display area DA but the driving voltage lines PL1, PL2, PL3, PL4, PL5, and PL6 around the first area A1 may be disconnected around the first area A1. A portion of the disconnected driving voltage lines PL1, PL2, PL3, PL4, PL5, and PL6 that may be arranged or disposed above the first area A1 may be electrically connected to sub-wirings (not shown) arranged or disposed in the peripheral area PA above and below the display area DA.

In an embodiment, similar to the data lines DL0, DL1, DL2, DL3, DL4, DL5, DL6, and DL7, the driving voltage lines PL1, PL2, PL3, PL4, PL5, and PL6 may not be disconnected and may be continuously provided or disposed around the first area A1. In this case, similar to the data lines DL1, DL2, DL3, DL4, DL5, and DL6 described below, the driving voltage lines PL1, PL2, PL3, PL4, PL5, and PL6 each may include an extension portion extending in the y-direction and a detouring portion detouring along the edge of the first area A1.

Some or a predetermined number of data lines DL1, DL2, DL3, DL4, DL5, and DL6 may detour around the first area A1. For example, the data lines DL1, DL2, DL3, DL4, DL5, and DL6 may respectively include extension portions DL1-SP, DL2-SP, DL3-SP, DL4-SP, DL5-SP, and DL6-SP extending in the y-direction and detouring portions DL1-CP, DL2-CP, DL3-CP, DL4-CP, DL5-CP, and DL6-CP detouring along the edge of the first area A1. The detouring portions DL1-CP, DL2-CP, DL3-CP, DL4-CP, DL5-CP, and DL6-CP of the data lines DL1, DL2, DL3, DL4, DL5, and DL6 may be located or disposed in the first extension area EA1 and the second area A2. The extension portions DL3-SP and DL4-SP of the data lines DL3 and DL4 that may neighbor the first area A1 among the data lines DL1, DL2, DL3, DL4, DL5, and DL6 may be longer than the extension portions DL1-SP and DL6-SP of the data lines DL1 and DL6 that may neighbor the display area DA.

Pixels P located or disposed above and below the first area A1 may be electrically connected to the data lines DL1, DL2, DL3, DL4, DL5, and DL6 detouring around the first area A1 and may receive a signal from the relevant data lines DL1, DL2, DL3, DL4, DL5, and DL6. The first to third data lines DL1, DL2, and DL3 among the data lines DL1, DL2, DL3, DL4, DL5, and DL6 may be curved along a left edge of the first area A1, and the fourth to sixth data lines DL4, DL5, and DL6 may be curved along a right edge of the first area A1. Though it is shown in FIG. 7 that three data lines may be respectively arranged or disposed left and right around the first area A1, for convenience of illustration and description, the number of data lines may be substantially more than three.

Referring to FIGS. 7, 8A, and 8B, the data lines DL1, DL2, DL3, DL4, DL5, and DL6 may include a first conductive line CL1 and a second conductive line CL2 in the first extension area EA1 and the second area A2, the first conductive line CL1 and the second conductive line CL2 may constitute the detouring portions DL1-CP, DL2-CP, DL3-CP, DL4-CP, DL5-CP, and DL6-CP. In this case, the first conductive line CL1 and the second conductive line CL2 may be alternately arranged or disposed on different layers. Data lines (for example, the first data line DL1 and the second data line DL2) that may be closest to each other among the data lines DL1, DL2, DL3, DL4, DL5, and DL6 may include conductive lines arranged or disposed on different layers in the second area A2. Through this, a pitch between the data lines DL1, DL2, DL3, DL4, DL5, and DL6 may be =reduced, and a non-display area (for example, the second area A2) around the first area A1 may be effectively reduced.

Referring to FIG. 8A shown based on the first data line DL1, the first data line DL1 may include the first conductive line CL1 and a third conductive line CL3, the first conductive line CL1 may be located or disposed in the second area A2, and the third conductive line CL3 may be located or disposed in the display area DA. The first conductive line CL1 may be arranged or disposed on the gate insulating layer 120 and may include the same or similar material as that of the gate electrode 213 of FIG. 6. The third conductive line CL3 may be arranged or disposed on the second interlayer insulating layer 140 and may include the same or similar material as that of the source electrode 215a and the drain electrode 215b of FIG. 6.

The first conductive line CL1 may contact the third conductive line CL3 and may be electrically connected to the third conductive line CL3 through a contact hole CNT. The contact hole CNT of FIG. 8A may be defined by the first interlayer insulating layer 130 and the second interlayer insulating layer 140. A first data signal transferred through the first data line DL1 may be transferred from the third conductive line CL3 in a lower portion of the first area A1 to the third conductive line CL3 in an upper portion of the first area A1 through the first conductive line CL1.

Referring to FIG. 8B shown based on the second data line DL2, the second data line DL2 may include the second conductive line CL2 and the third conductive line CL3, the second conductive line CL2 may be located or disposed in the second area A2, and the third conductive line CL3 may be located or disposed in the display area DA. The second conductive line CL2 may be arranged or disposed on the first interlayer insulating layer 130 and may include the same or similar material as that of the top electrode CE2 of FIG. 6. The third conductive line CL3 may be arranged or disposed on the second interlayer insulating layer 140 and may include the same or similar material as that of the source electrode 215a and the drain electrode 215b of FIG. 6.

The second conductive line CL2 may contact the third conductive line CL3 and may be electrically connected to the third conductive line CL3 through a contact hole CNT. The contact hole CNT of FIG. 8B may be defined by the second interlayer insulating layer 140. A second data signal transferred through the second data line DL2 may be transferred from the third conductive line CL3 in a lower portion of the first area A1 to the third conductive line CL3 in an upper portion of the first area A1 through the second conductive line CL2.

For reference, the third conductive line CL3 of FIG. 8A and the third conductive line CL3 of FIG. 8B may include different signal lines arranged or disposed on the same layer. The third conductive line CL3 of FIG. 8A may include a portion of the first data line DL1, and the third conductive line CL3 of FIG. 8B may include a portion of the second data line DL2.

In an embodiment, different from FIGS. 8A and 8B, the third conductive line CL3 may be arranged or disposed on the first planarization layer 150 and may include the same or similar material as that of the connection metal 155 of FIG. 6.

Although FIGS. 8A and 8B show and describe the first data line DL1 and the second data line DL2 as representatives, these structures are equally applicable to the neighboring data lines DL3, DL4, DL5, and DL6. For example, the third to fifth data lines DL3, DL4, and DL5 may have a schematic cross-sectional structure similar to that of the first data line DL1, and the fourth and sixth data lines DL4 and DL6 may have a schematic cross-sectional structure similar to that of the second data line DL2.

The scan lines SL0, SL1, SL2, SL3, SL4, and SL5 may extend in the x-direction intersecting the data lines DL0, DL1, DL2, DL3, DL4, DL5, DL6, and DL7. Some or a predetermined number of scan lines SL0 and SL5 among the scan lines SL0, SL1, SL2, SL3, SL4, and SL5 may continuously extend to pass across the display area DA but the scan lines SL1, SL2, SL3, and SL4 around the first area A1 may be disconnected around the first area A1. A portion of the disconnected scan lines SL0, SL1, SL2, SL3, SL4, and SL5 on the left of the first area A1 may be electrically connected to a first scan driving circuit (not shown) arranged or disposed on the left of the display area DA, and a portion of the disconnected scan lines SL0, SL1, SL2, SL3, SL4, and SL5 on the right of the first area A1 may be electrically connected to a second scan driving circuit (not shown) arranged or disposed on the right of the display area DA.

Similar to the scan lines SL0, SL1, SL2, SL3, SL4, and SL5, electrode voltage lines HL0, HL1, HL2, HL3, and HL4 may extend in the x-direction intersecting the data lines DL0, DL1, DL2, DL3, DL4, DL5, DL6, and DL7. Some or a predetermined number of electrode voltage lines HL1 and HL4 among the electrode voltage lines HL0, HL1, HL2, HL3, and HL4 may continuously extend to pass across the display area DA but the electrode voltage lines HL1, HL2, and HL3 around the first area A1 may be disconnected around the first area A1. Portions of the disconnected electrode voltage lines HL1, HL2, and HL3 on the right and the left of the first area A1 may be respectively electrically connected to driving circuits (not shown) that may neighbor the first and second scan driving circuits.

As shown in FIG. 7, a pitch between neighboring data lines in the second area A2, for example, an interval d (referred to as a first pitch) between the detouring portions may be less than an interval D (referred to as a second pitch) between neighboring data lines in the display area DA. Display quality of some or a predetermined number of pixels located or disposed in the display area DA may be deteriorated by a parasitic capacitance between neighboring data lines having the first pitch d.

The display device 1 according to an embodiment may resolve an issue of display quality deterioration of some or certain pixels by forming the wirings of the fan-out unit 20 electrically connected to the data lines DL1, DL2, DL3, DL4, DL5, and DL6 such that some or certain wirings may have relatively wider widths.

FIG. 9 is an enlarged plan view of a region A of FIG. 2A and FIG. 2B.

Referring to FIG. 9, the peripheral area PA may include the first extension area EA1, the bent area BA, and the second extension area EA2 that may be continuous to one side of the display area DA, in addition to a region surrounding the display area DA. The fan-out unit 20 and the driving circuit unit 30 may be arranged or disposed in the peripheral area PA.

The first extension area EA1 and the second extension area EA2 may be defined as a top region and a bottom region around the bent area BA. For example, the bent area BA may be located or disposed between the first extension area EA1 and the second extension area EA2. The first extension area EA1 may include a region neighboring the fourth edge E4 and located or disposed between the display area DA and the bent area BA. The second extension area EA2 may include a region not viewed from the front side when the bent area BA may be bent, the second extension area EA2 being located or disposed between the bent area BA and the driving circuit unit 30.

As described above, like the peripheral area PA neighboring the first edge E1 to the third edge E3 of the display area DA as in FIG. 2A and FIG. 2B, the first extension area EA1 may include a peripheral area PA recognized by a user in a final display device or an electronic apparatus such as a smartphone including a display device. Since the fan-out unit 20 may be arranged or disposed in the first extension area EA1, the fan-out unit 20 including a bundle of wirings, it is not easy to reduce a width of the first extension area EA1 compared to other peripheral areas (for example, the peripheral areas contacting the first edge E1 to the third edge E3 of the display area DA).

Therefore, the display device according to an embodiment is implemented to reduce the width of the first extension area EA1 in the y-direction by dividing the fan-out unit 20 into a plurality of sections. Therefore, in an embodiment, the width of the first extension area EA1 in the y-direction may be less than the width of the second extension area EA2.

The plurality of sections may respectively correspond to first wiring portions 21 and a second wiring portion 22 of the fan-out unit 20. The first wiring portions 21 and the second wiring portion 22 may be apart from each other in the bent area BA with a separation area SA therebetween.

The fan-out unit 20 may include wirings W1 and W2 and may transfer a data signal applied from the driving circuit unit 30 to the display unit 10 through the wirings W1 and W2. The wirings W1 and W2 may be electrically connected to the data lines DL (see FIG. 5) crossing the display area DA in the y-direction and may transfer a data signal to the data lines DL.

The wirings W1 and W2 may be arranged or disposed to sequentially cross the first extension area EA1, the bent area BA, and the second extension area EA2. As in FIG. 9, the wirings W1 and W2 may be bent at least twice in a plan view. Portions in which the wirings W1 and W2 may be bent may be located or disposed in the first extension area EA1 and the second extension area EA2. Since stress may be concentrated on the bent area BA, the portions in which the wirings W1 and W2 may be bent may be formed to avoid the bent area BA which has a high risk of disconnection.

The wirings W1 and W2 may include a straight line portion and an oblique line portion, the straight line portion extending in a direction approximately parallel to the y-direction in the first extension area EA1 and the second extension area EA2, the oblique line portion extending in a diagonal direction crossing or intersecting the x-direction and the y-direction. The wirings W1 and W2 may extend in a direction approximately parallel to the y-direction in the bent area BA.

In an embodiment, as in FIG. 9, the first wiring portions 21 may be located or disposed on two opposite sides with the second wiring portion 22 therebetween. As a whole, the fan-out unit 20 may be provided in a substantially symmetrical shape. The first wiring portions 21 may be provided in a substantially symmetric shape with respect to a central axis CAX, and the second wiring portion 22 may be arranged or disposed on one side and another side of the first wiring portions 21.

Figure 13:
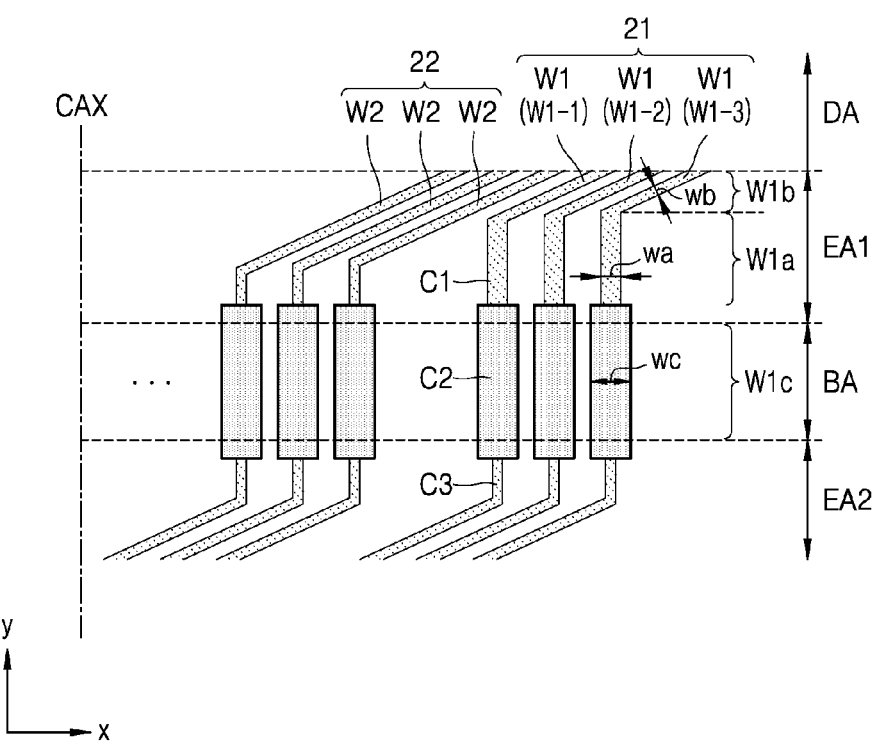
FIG. 13 is a plan view of a portion or region of a display device according to an embodiment.
Figure 14:
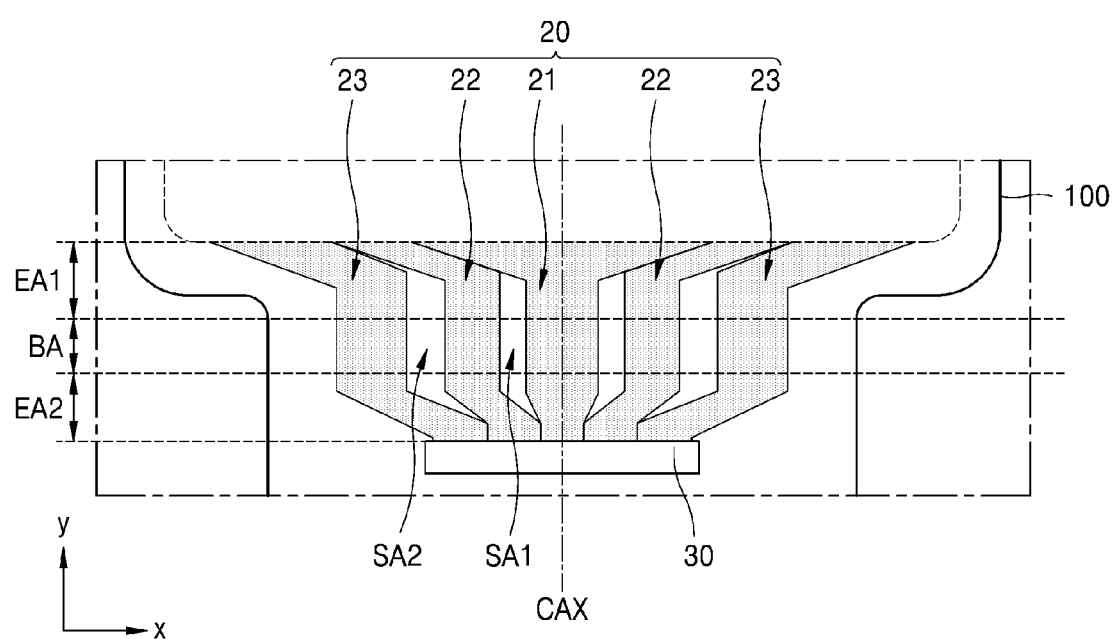
FIGS. 14 and 15 are plan views of a portion or region of a display device according to an embodiment.

In an embodiment, as shown in FIGS. 13 and 14, the fan-out unit 20 may include the wiring portions 21, 22, and 23, each of the wiring portions 21, 22, and 23 may be divided into at least three sections.

Figure 10:
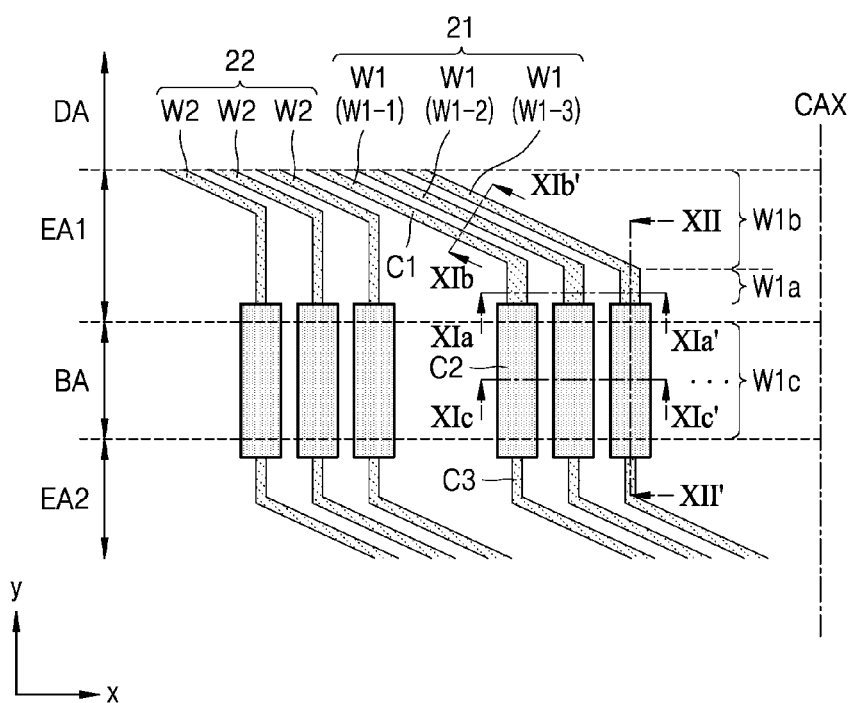
FIG. 10 is an enlarged plan view of a portion or region of FIG. 9.
Figure 11:
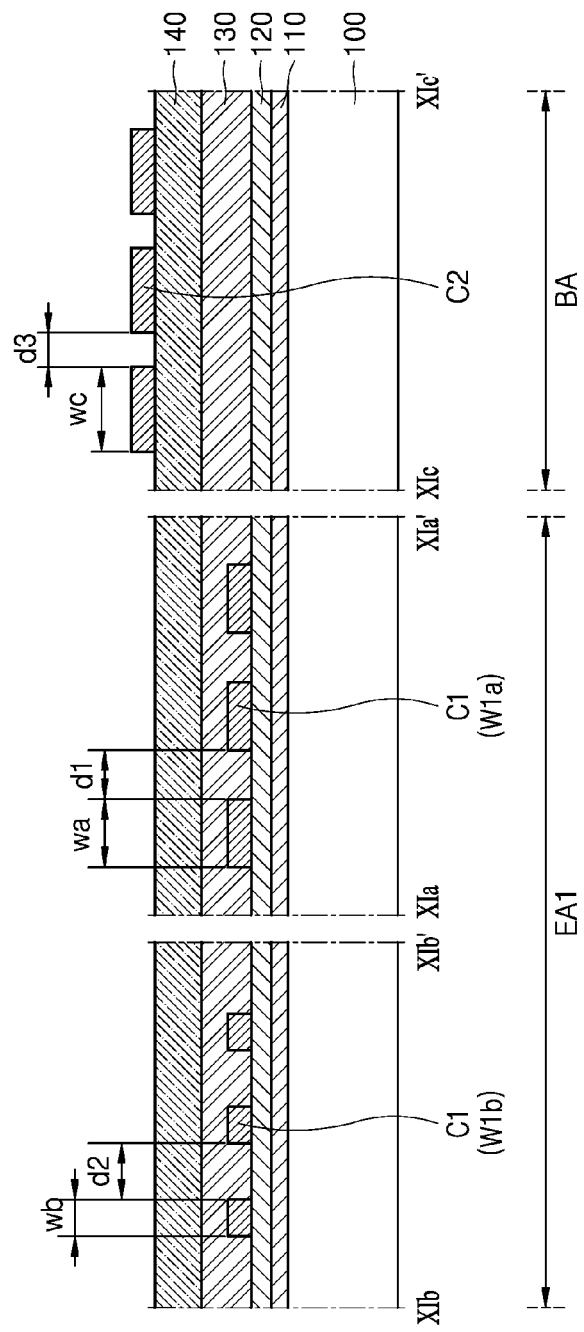
FIGS. 11 and 12 are schematic cross-sectional views of a portion or region of FIG. 10.
Figure 12:
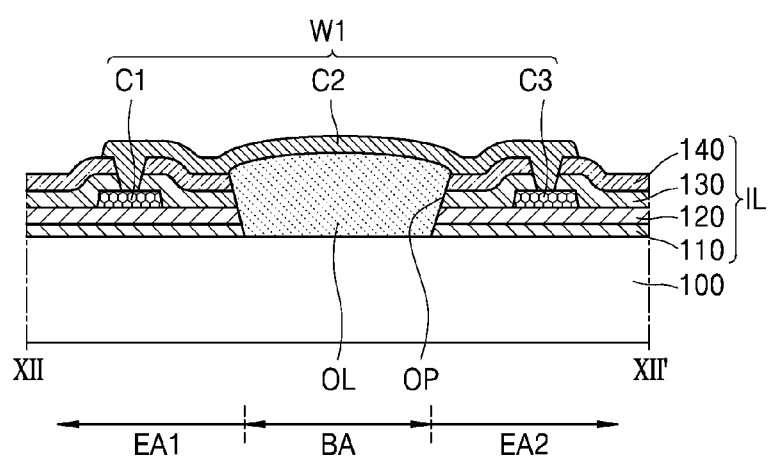

FIG. 10 is an enlarged plan view of a portion or region of FIG. 9, and FIGS. 11 and 12 are schematic cross-sectional views of a portion or region of FIG. 10. FIG. 11 is a schematic cross-sectional view of the portion or region of FIG. 10 taken along lines XIa-XIa, XIb-XIb, and XIc-XIc, and FIG. 12 is a schematic cross-sectional view of the portion or region of FIG. 10 taken along line XII-XII.

Referring to FIG. 10, the first wiring portion 21 may include first wirings W1, and the second wiring portion 22 may include second wirings W2. Though it is shown in FIG. 10, for convenience of description, that the first wiring portion 21 and the second wiring portion 22 respectively include three first wirings W1 and three second wirings W2, the first wiring portion 21 and the second wiring portion 22 each may include more than three wirings.

FIG. 10 may correspond to a portion or region of the display device 1 in which the first area A1 may be located or disposed on or near a top center of the display area DA as shown in FIG. 2A. Since the first area A1 of the display device 1 in FIG. 2A may be located or disposed on or near the top center of the display area DA, the first wiring portion 21 electrically connected to the data lines DL1, DL2, DL3, DL4, DL5, and DL6 may be located or disposed on the central portion of the fan-out unit 20, the data lines DL1, DL2, DL3, DL4, DL5, and DL6 detouring around the first area A1. Referring to FIG. 10, the first wiring portion 21 may be located or disposed closer to the central axis CAX than the second wiring portion 22. This may mean that the first wiring portion 21 is approximately located or disposed on the central portion of the fan-out unit 20. In an embodiment, the location of the first wiring portion 21 may be changed depending on the location of the first area A1 inside the display area DA.

In an embodiment, each of first wirings W1-1, W1-2, and W1-3 may be respectively and electrically connected to the first to third data lines DL1, DL2, and DL3 of FIG. 7. Referring to FIGS. 7 and 10 together, the (1-1)st wiring W1-1 may supply a data signal to the first data line DL1, the (1-2)st wiring W1-2 may supply a data signal to the second data line DL2, and the (1-3)st wiring W1-3 may supply a data signal to the third data line DL3.

FIG. 10 shows the first wirings W1-1, W1-2, and W1-3 arranged or disposed on the left with respect to the central axis CAX. Though not shown, the first wirings may be symmetrically arranged or disposed also on the right with respect to the central axis CAX. The first wirings arranged or disposed on the right with respect to the central axis CAX may be electrically connected to the fourth to sixth data lines DL4, DL5, and DL6 of FIG. 7.

In the first extension area EA1, each of the first wirings W1 may include a first portion W1a and a second portion W1b, the first portion W1a extending in the first direction (in other words, the y-direction), and the second portion W1b extending in the second direction intersecting the y-direction. The first portion W1a and the second portion W1b may be distinguished based on a bent portion and may be denoted by a straight line portion and an oblique line portion of the fan-out unit 20.

Referring to FIGS. 10 and 11 together, a width wa of the first portion W1a of the first wirings W1 may be greater than a width wb of the second portion W1b of the first wirings W1. In an embodiment, the width wa of the first portion W1a may be about 1.5 to about 2 times greater than the width wb of the second portion W1b, and, about 1.6 times greater than the width wb of the second portion W1b. An interval d1 between the first portions W1a of the first wirings W1 may be equal to or the same as an interval d2 between the second portions W1b of the first wirings W1.

As a comparative example, in the case where the width of the first portion of the first wirings W1 is the same as the width of the second portion of the first wirings W1, a voltage drop of a data signal may occur, the data signal being transferred to a data line DL around the first area A1 electrically connected to at least some or a predetermined number of the first wirings W1. This voltage drop may be represented as a brightness reduction defect of the pixels around the first area A1.

As described above, at least some or a predetermined number of first wirings W1-1, W1-2, and W1-3 among the first wirings W1 of the first wiring portion 21 may be electrically connected to the data lines DL1, DL2, DL3, DL4, DL5, and DL6 (see FIG. 7) having at least a portion routed around the first area A1. Since the width wa of the first portion W1a of each of the first wirings W1 may be designed greater than the width wb of the second portion W1b, a voltage drop of a data signal transferred to the data lines DL1, DL2, DL3, DL4, DL5, and DL6 around the first area A1 may be prevented and thus reduction of the brightness of the pixels P around the first area A1 may be prevented.

In the second wirings W2 included in the second wiring portion 22, a width of a straight line portion and a width of an oblique line portion may be the same. Data lines of the display area DA electrically connected to the second wirings W2 of the second wiring portion 22 may be sufficiently apart from the first area A1 and may not constitute a routing portion that detours around the first area A1, and thus an issue of brightness reduction of the pixel P electrically connected to the data line may not occur.

Each of the first wirings W1 may include a third portion W1c located or disposed in the bent area BA. Though it is shown in FIG. 10 that the third portion W1c partially extends to the first extension area EA1 and the second extension area EA2, the embodiment is not limited thereto.

In an embodiment, a width wc of the third portion W1c may be greater than the width wa of the first portion W1a.

Therefore, in each of the first wirings W1, the width wa of the first portion W1a, the width wb of the second portion W1b, and the width wc of the third portion W1c meet Equation 1 below.

$$wc > wa > wb \qquad \text{Equation 1}$$

In an embodiment, the width wc of the third portion W1c may be the same as the width wa of the first portion W1a. However, even in this case, the width wa of the first portion W1a may be greater than the width wb of the second portion W1b.

Similar to the first wiring portion 21, a width of each of the second wirings W2 of the second wiring portion 22 in the bent area BA may be greater than a width of each of the second wirings W2 of the second wiring portion 22 in the first extension area EA1 and the second extension area EA2 in a plan view.

Referring to FIGS. 11 and 12, each of the first wirings W1 may include a first conductive layer C1, a second conductive layer C2, and a third conductive layer C3, the first conductive layer C1 may be located or disposed in the first extension area EA1, the second conductive layer C2 may be located or disposed in the bent area BA, and the third conductive layer C3 may be located or disposed in the second extension area EA2. As shown in FIG. 12, the first conductive layer C1, the second conductive layer C2, and the third conductive layer C3 may be electrically connected to each other.

The first conductive layer C1 and the third conductive layer C3 may be arranged or disposed on the same layer and may include the same or similar material. As shown in FIGS. 11 and 12, the first conductive layer C1 and the third conductive layer C3 may be arranged or disposed on the gate insulating layer 120. Referring to FIG. 6, the first conductive layer C1 and the third conductive layer C3 may include the same or similar material as that of the gate electrode 213. In an embodiment, the first conductive layer C1 and the third conductive layer C3 may include molybdenum (Mo).

The second conductive layer C2 may be arranged or disposed on a layer different from the first conductive layer C1 and the third conductive layer C3 and may include a material different from that of the first conductive layer C1 and the third conductive layer C3. As shown in FIGS. 11 and 12, the second conductive layer C2 may be arranged or disposed on the second interlayer insulating layer 140. Referring to FIG. 6, the second conductive layer C2 may include the same or similar material as that of the source electrode 215a and the drain electrode 215b. In an embodiment, the second conductive layer C2 may include aluminum (Al).

Referring to FIG. 12, an opening OP may be located or disposed in the bent area BA. The opening OP may be formed by removing a portion of the inorganic insulating layer IL to expose at least a portion of the substrate 100. As shown in FIG. 12, the inorganic insulating layer IL may include, for example, the buffer layer 110, the gate insulating layer 120, the first interlayer insulating layer 130, and the second interlayer insulating layer 140. In an embodiment, in the case where the second interlayer insulating layer 140 includes an organic material, the inorganic insulating layer IL may include the buffer layer 110, the gate insulating layer 120, and the first interlayer insulating layer 130.

The opening OP may be filled with an organic layer OL. Since the inorganic layer is vulnerable to stress compared to the organic layer, stress on the bent area BA may be alleviated by removing a portion of the inorganic insulating layer IL arranged or disposed in the bent area BA and then filling the opening OP with the organic layer OL.

Each of the first wirings W1 may include the first conductive layer C1, the second conductive layer C2, and the third conductive layer C3, the first conductive layer C1 being located or disposed in the first extension area EA1, the second conductive layer C2 being located or disposed in the bent area BA, and the third conductive layer C3 being located or disposed in the second extension area EA2.

The first conductive layer C1 and the third conductive layer C3 may be arranged or disposed on the same layer, and the second conductive layer C2 may be arranged or disposed on a layer different from the first conductive layer C1 and the third conductive layer C3. For example, in FIG. 12, the first conductive layer C1 and the third conductive layer C3 may be arranged or disposed on the gate insulating layer 120, and the second conductive layer C2 may be arranged or disposed on the organic layer OL and the second interlayer insulating layer 140.

The first conductive layer C1 and the third conductive layer C3 may be directly electrically connected to the second conductive layer C2 through contact holes formed in the first interlayer insulating layer 130 and the second interlayer insulating layer 140. Since the conductive layers arranged or disposed on different layers around the bent area BA may be electrically connected to each other as described above, the reliability of the wirings of the fan-out unit 20 passing across the bent area BA may be improved.

Although FIGS. 11 and 12 show the first wiring portion 21, a schematic cross-sectional structure of the second wiring portion 22 may be the same as that of the first wiring portion 21 except for a width change of the straight line portion.

FIG. 13 is a plan view of a portion or region of the display device 1 according to an embodiment.

FIG. 13 is similar to FIG. 10 but different from FIG. 10 in the location of the first area A1 inside the display area DA. For example, as in the display device 1 of FIG. 2A, the first wiring portion 21 of FIG. 10 may correspond to the case where the first area A1 may be located or disposed on or near the top center of the display area DA. As in the display device 1 of FIG. 2B, the first wiring portion 21 of FIG. 13 may correspond to the case where the first area A1 may be located or disposed on or near the top right of the display area DA.

Referring to FIG. 13, the first wiring portion 21 may be located or disposed farther away from the central axis CAX than the second wiring portion 22. FIG. 13 may correspond to a portion or region of the display device 1 where the first area A1 may be located or disposed on or near the top right of the display area DA as shown in FIG. 2B. In the display device 1 of FIG. 2B, since the first area A1 may be located or disposed on or near the top right of the display area DA, the first wiring portion 21 may be located or disposed on or near the right of the fan-out unit 20, the first wiring portion 21 being electrically connected to the data lines DL1, DL2, DL3, DL4, DL5, and DL6 that may detour around the first area A1.

In an embodiment, in the case where the first area A1 may be located or disposed on or near the top left of the display area DA, the first wiring portion 21 may be located or disposed on the left of the fan-out unit 20, the first wiring portion 21 being electrically connected to the data lines DL1, DL2, DL3, DL4, DL5, and DL6 that may detour around the first area A1. This may mean that the location of the first wiring portion 21 is not limited to a specific part and may be changed within the fan-out unit 20 in cooperation with the location of the first area A1.

In FIG. 13, in each of the first wirings W1, the width wa of the first portion W1a may be greater than the width wb of the second portion W1b. In an embodiment, the width wa of the first portion W1a may be about 1.5 to about 2 times greater than the width wb of the second portion W1b, and, about 1.6 times greater than the width wb of the second portion W1b. An interval d1 between the first portions W1a of the first wirings W1 may be equal to or the same as an interval d2 between the second portions W1b of the first wirings W1.

Each of the first wirings W1 may include the third portion W1c located or disposed in the bent area BA. The width wc of the third portion W1c may be greater than the width wa of the first portion W1a. Therefore, in a plan view, the width of each of the first wirings W1 may be reduced in the order of the third portion W1c, the first portion W1a, and the second portion W1b. In an embodiment, the width wc of the third portion W1c and the width wa of the first portion W1a may be the same or about the same. Even in this case, the width wa of the first portion W1a should be greater than the width wb of the second portion W1b.

The second wirings W2 of the second wiring portion 22 may have a structure similar to the structure shown in FIG. 10.

Figure 15:
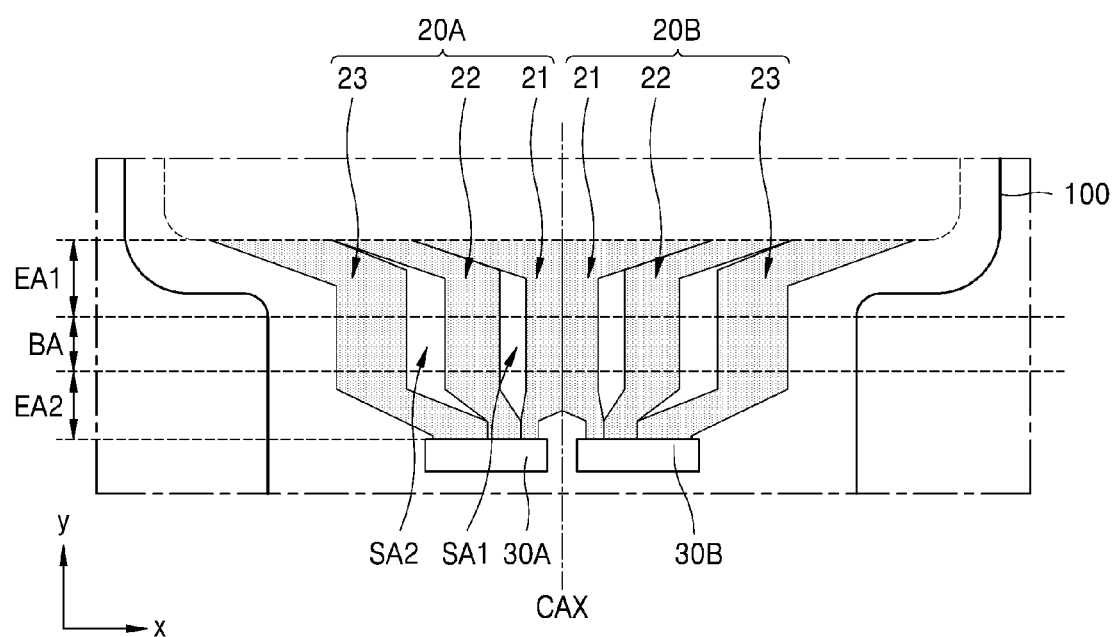

FIGS. 14 and 15 are plan views of a portion or region of the display device 1 according to an embodiment.

FIGS. 14 and 15 are modified embodiments of FIG. 9. The fan-out unit 20 may include the first wiring portion 21, the second wiring portion 22, and the third wiring portion 23. The first wiring portion 21 may be apart from the second wiring portion 22 with a first separation area SA1 therebetween in the bent area BA. The second wiring portion 22 may be apart from the third wiring portion 23 with a second separation area SA2 therebetween in the bent area BA.

Referring to FIG. 14, the first wiring portion 21 may be located or disposed on the central portion of the fan-out unit 20, and the second wiring portion 22 and the third wiring portion 23 may be respectively located or disposed outside the first wiring portion 21. The third wiring portion 23 may be located or disposed on an outermost side of the fan-out unit 20.

In the case where the first wiring portion 21 may be located or disposed on or near the central portion of the fan-out unit 20 as in an embodiment, the first area A1 may be located or disposed on or near the top center of the display area DA. In an embodiment, in the case where the first area A1 may be located or disposed on or near the left or right from the center instead of the center of the display area DA, the first wiring portion 21 may move to the location of the second wiring portion 22 or the location of the third wiring portion 23 in FIG. 14.

Referring to FIG. 15, the fan-out unit 20 may include a first fan-out unit 20A and a second fan-out unit 20B which may be substantially symmetric with respect to the central axis CAX. The first fan-out unit 20A and the second fan-out unit 20B may respectively receive signals from a first driving circuit unit 30A and a second driving circuit unit 30B.

The first wiring portion 21 may be located or disposed on the central portion of the fan-out unit 20, and the second wiring portion 22 and the third wiring portion 23 may be respectively located or disposed outside the first wiring portion 21. The third wiring portion 23 may be located or disposed on an outermost side of the fan-out unit 20.

In the case where the first wiring portion 21 may be located or disposed on the central portion of the fan-out unit 20, the first area A1 may be located or disposed on or near the top center of the display area DA. Since the fan-out unit 20 may include the first fan-out unit 20A and the second fan-out unit 20B which may be substantially symmetric with respect to the central axis CAX, in this case, the data lines DL1, DL2, and DL3 arranged or disposed on the left of the first area A1 in FIG. 7 may be electrically connected to the first wiring portion 21 of the first fan-out unit 20A, and the data lines DL4, DL5, and DL6 arranged or disposed on the right of the first area A1 may be electrically connected to the second wiring portion 22 of the second fan-out unit 20B.

As described above, in the display device 1 according to an embodiment, since the width wa of the first portion W1a of each of the first wirings W1 is designed greater than the width wb of the second portion W1b, reduction of the brightness of the pixels P around the first area A1 may be prevented and display quality may be improved.

Up to now, though only the display device has been described, the disclosure is not limited thereto. For example, a method of manufacturing the display device also falls within the scope of the disclosure.

According to an embodiment, a display device in which emission uniformity of an emission area is improved may be implemented. The scope of the disclosure, however, is not limited by this effect.

It should be understood that embodiments described herein should be considered in a descriptive sense only and not for purposes of limitation. Descriptions of features or aspects within each embodiment should typically be considered as available for other similar features or aspects in other embodiments. While one or more embodiments have been described with reference to the figures, it will be understood by those of ordinary skill in the art that various changes in form and details may be made therein without departing from the spirit and scope as defined by the following claims.

What is claimed is:

1. A display device comprising:
    a substrate that includes:
        a first area;
        a display area surrounding the first area; and
        a peripheral area surrounding the display area and including a bent area;
    a display unit disposed in the display area and including a plurality of pixels;
    a driving circuit disposed in the peripheral area; and
    a fan-out unit disposed in the peripheral area between the display unit and the driving circuit to transfer a data signal applied from the driving circuit to the display unit, the fan-out unit including a first wiring portion and a second wiring portion spaced apart from each other in the bent area, wherein
    the first wiring portion includes a plurality of first wirings,
        each of the plurality of first wirings includes:
            a first portion extending in a first direction between the display unit and the bent area; and
            a second portion extending in a second direction intersecting the first direction, a width of the first portion being greater than a width of the second portion, and
        each of the plurality of first wirings includes:
            a first conductive layer disposed between the display area and the bent area;
            a second conductive layer disposed in the bent area; and a third conductive layer disposed between the bent area and the driving circuit, wherein the first conductive layer, the second conductive layer, and the third conductive layer are electrically connected to each other.

2. The display device of claim 1, wherein
a predetermined number of the plurality of first wirings are electrically connected to a plurality of data lines, and
a predetermined number of the data lines are routed with respect to the first area.

3. The display device of claim 1, wherein, in the plurality of first wirings, an interval between first portions is equal to or greater than an interval between second portions.

4. The display device of claim 1, wherein a width of the first portion is about 1.5 to about 2 times greater than a width of the second portion.

5. The display device of claim 1, wherein
each of the plurality of first wirings includes a third portion disposed in the bent area, and
a width of the third portion is greater than a width of the first portion.

6. The display device of claim 1, wherein the first conductive layer and the third conductive layer include a same material.

7. The display device of claim 1, wherein the second conductive layer includes a material different from a material of the first conductive layer and a material of the third conductive layer.

8. The display device of claim 1, wherein the first conductive layer and the third conductive layer include molybdenum (Mo).

9. The display device of claim 1, wherein the second conductive layer includes aluminum (Al).

10. The display device of claim 1, wherein the second conductive layer is electrically connected to the first conductive layer and the third conductive layer through contact holes passing through an insulating layer disposed outside of the bent area.

11. The display device of claim 1, wherein
the display unit includes:
a pixel circuit; and
a display element electrically connected to the pixel circuit,
the pixel circuit includes a thin-film transistor including:
a semiconductor layer;
a gate electrode overlapping a portion of the semiconductor layer; and
an electrode layer disposed above the gate electrode, and
the first conductive layer and the gate electrode include a same material.

12. The display device of claim 11, wherein the second conductive layer and the electrode layer includes a same material.

13. The display device of claim 1, wherein the first area includes a transparent region.

14. The display device of claim 1, wherein the first area includes a non-display area.

15. The display device of claim 1, wherein the first area is disposed at a top center of the display area.

16. The display device of claim 1, wherein the first wiring portion is disposed at a central portion of the fan-out unit.

17. The display device of claim 1, wherein the first area is disposed at a top-left side of the display area.

18. The display device of claim 17, wherein the first wiring portion is disposed at a left side with respect to a central portion of the fan-out unit.

19. The display device of claim 1, wherein the first area is disposed at a top-right side of the display area.

20. The display device of claim 19, wherein the first wiring portion is disposed at a right side with respect to a central portion of the fan-out unit.

21. The display device of claim 1, comprising a component disposed at a side of the substrate corresponding to the first area.

22. The display device of claim 1, wherein for each of the plurality of first wirings includes a second portion on a side of a respective first portion away from the bent area.

* * * * *